(12) United States Patent
Soininen et al.

(10) Patent No.: US 11,549,702 B2
(45) Date of Patent: Jan. 10, 2023

(54) PRECURSOR SUPPLY CABINET

(71) Applicant: BENEQ OY, Espoo (FI)

(72) Inventors: Pekka Soininen, Espoo (FI); Johannes Wesslin, Espoo (FI); Matti Malila, Espoo (FI)

(73) Assignee: BENEQ OY, Espoo (FI)

( * ) Notice: Subject to any disclaimer, the term of this patent is extended or adjusted under 35 U.S.C. 154(b) by 0 days.

(21) Appl. No.: 17/605,602

(22) PCT Filed: Apr. 24, 2020

(86) PCT No.: PCT/FI2020/050268
§ 371 (c)(1),
(2) Date: Oct. 22, 2021

(87) PCT Pub. No.: WO2020/216995
PCT Pub. Date: Oct. 29, 2020

(65) Prior Publication Data
US 2022/0146051 A1    May 12, 2022

(30) Foreign Application Priority Data
Apr. 25, 2019 (FI) .................................. 20195337

(51) Int. Cl.
*F24F 7/007* (2006.01)
*F24F 7/00* (2021.01)
(Continued)

(52) U.S. Cl.
CPC ............... *F24F 7/007* (2013.01); *F24F 7/00* (2013.01); *F24F 7/08* (2013.01);
(Continued)

(58) Field of Classification Search
CPC ...... F24F 7/007; F24F 7/00; F24F 7/08; F24F 2007/001; F24F 2007/0025;
(Continued)

(56) References Cited

U.S. PATENT DOCUMENTS 4,625,627 A * 12/1986 Livanos ................ F17C 13/084
454/49
6,319,327 B1 11/2001 Tsukada et al.
(Continued)

FOREIGN PATENT DOCUMENTS

EP    0844431 A2    5/1998
WO    9113679 A1    9/1991

OTHER PUBLICATIONS

Finnish Search Report issued by the Finnish Patent and Registration Office in relation to Finnish Application No. 20195337 dated Nov. 14, 2019 (1 page).
(Continued)

*Primary Examiner* — Steven B McAllister
*Assistant Examiner* — Charles R Brawner
(74) *Attorney, Agent, or Firm* — Robert P. Michal, Esq.; Carter, DeLuca & Farrell LLP

(57) ABSTRACT

A precursor supply cabinet for accommodating one or more precursor containers having cabinet walls defining an inner cabinet space. The precursor supply cabinet includes a ventilation discharge connection arranged to discharge ventilation gas from the inner cabinet space, one or more ventilation inlet connections, two or more separate gas tight precursor supply chambers for accommodating precursor containers. The gas tight precursor supply chambers are arranged inside the inner cabinet space of the precursor supply cabinet such that the inner cabinet space of the precursor supply cabinet surrounding the separate gas tight precursor supply chambers is ventilated.

17 Claims, 16 Drawing Sheets

(51) Int. Cl.
  *F24F 7/08* (2006.01)
  *F17C 13/08* (2006.01)
  *C23C 16/455* (2006.01)

(52) U.S. Cl.
  CPC .. *C23C 16/45544* (2013.01); *C23C 16/45561* (2013.01); *F17C 13/08* (2013.01); *F17C 2205/0111* (2013.01); *F17C 2270/0518* (2013.01); *F24F 2007/001* (2013.01); *F24F 2007/0025* (2021.01)

(58) Field of Classification Search
  CPC ......... C23C 16/45544; C23C 16/45561; F17C 13/08; F17C 2205/0111; F17C 2270/0815
  USPC ........................................................ 454/193
  See application file for complete search history.

(56) References Cited

U.S. PATENT DOCUMENTS

| | | | | |
|---|---|---|---|---|
| 2004/0007348 A1* | 1/2004 | Stoller | .................. | H05K 7/206 165/47 |
| 2009/0214779 A1 | 8/2009 | Sarigiannis et al. | | |
| 2010/0213200 A1* | 8/2010 | Deane | ................ | B65D 81/3802 220/592.2 |
| 2010/0322604 A1 | 12/2010 | Fondurulia et al. | | |
| 2012/0315837 A1* | 12/2012 | Olander | .................. | F17C 11/00 454/340 |
| 2014/0319984 A1* | 10/2014 | Younts | ............... | H05K 7/20172 312/236 |
| 2017/0218513 A1 | 8/2017 | Nakada et al. | | |
| 2018/0163307 A1* | 6/2018 | Carlson | .................. | C23C 16/52 |
| 2020/0240675 A1* | 7/2020 | Brandt | .................... | F24F 11/74 |

OTHER PUBLICATIONS

International Search Report issued by the Finnish Patent and Registration Office acting as the International Searching Authority in relation to International Application No. PCT/FI2020/050268 dated Jul. 17, 2020 (5 pages).

Written Opinion of the International Searching Authority issued by the Finnish Patent and Registration Office acting as the International Searching Authority in relation to International Application No. PCT/FI2020/050268 dated Jul. 17, 2020 (7 pages).

* cited by examiner

PRECURSOR SUPPLY CABINET

CROSS-REFERENCE TO RELATED APPLICATIONS

This application is a national phase entry under 35 U.S.C. 371 of PCT International Application No. PCT/FI2020/050268 filed Apr. 24, 2020, which claims priority to Finnish Patent Application No. 20195337, filed Apr. 25, 2019, the disclosure of each of these applications is expressly incorporated herein by reference in their entirety.

FIELD OF THE INVENTION

The present invention relates to a precursor supply cabinet.

BACKGROUND OF THE INVENTION

Precursor gases are supplied from precursor containers or precursor vessels to a reaction chamber of an atomic layer deposition apparatus. A substrate to be processed is further placed into the reaction chamber such that it may be processed with the precursor gases according to principles of atomic layer deposition. The precursor containers are conventionally arranged into a ventilated space and precursor conduits extend from the precursor containers in the ventilated space towards the reaction chamber. The precursors are further supplied to the reaction chamber in heated state. Therefore, the precursor containers and the precursor conduits are heated with heating elements for maintaining the precursors at the elevated temperature in the ventilated space and for preventing decrease of precursor temperature and condensation.

One of the disadvantages associated with the prior art is that all precursor containers and precursor conduits have to be separately insulated and heated in the ventilated space. Further, the control of the temperatures of the precursors is difficult as the ventilation gas cools and affect the temperature of the precursor containers and precursor conduits. This makes controlling the temperatures difficult and complicated. Different precursor materials require different temperatures and therefore each precursor container and precursor conduit must be separately insulated and heated. However, the heated precursor containers and precursor conduits affect each other making the control of temperatures difficult.

BRIEF DESCRIPTION OF THE INVENTION

An object of the present invention is to provide a precursor supply cabinet so as to solve or at least alleviate the prior art disadvantages.

The preferred embodiments of the invention are disclosed in the dependent claims.

The invention is based on the idea of providing a precursor supply cabinet for accommodating one or more precursor containers. The precursor supply cabinet has cabinet walls defining an inner cabinet space. The precursor supply cabinet comprises: a ventilation discharge connection arranged to discharge ventilation gas from the inner cabinet space of the precursor supply cabinet and one or more ventilation inlet connections arranged to provide ventilation gas into the inner cabinet space of the precursor supply cabinet. The precursor supply cabinet further comprises one or more separate gas tight precursor supply chambers, or two or more, for accommodating precursor containers. The one or more gas tight precursor supply chambers being arranged inside the inner cabinet space of the precursor supply cabinet such that the inner cabinet space of the precursor supply cabinet surrounding the one or more separate gas tight precursor supply chambers is ventilated.

According to the above mentioned one or more, or two or more, gas tight precursor supply cabinets are arranged inside the inner cabinet space such that the one or more gas tight precursor supply chambers are inside ventilated space, the inner cabinet space. Thus, the outer surfaces of the precursor supply chambers are ventilated but the gas tight structure of the precursor supply chambers prevents ventilation gas from entering inside the precursor supply chambers. The precursor containers are accommodated inside the precursor supply chambers and thus they are not subjected to the ventilation gas or ventilation flow.

In the context of this application, in relation to precursor supply chamber gas tight means that there is substantially no gas flow between the chamber space inside the precursor supply chamber and the outside of the precursor supply chamber, meaning the inner cabinet space. Accordingly, gas tight means that leakage flow is less than 5 standard litre per minute (slm) into the chamber space of the precursor supply chamber from inner cabinet space of the precursor supply cabinet, or between the chamber space and the inner cabinet space of the precursor supply cabinet. Preferably, the gas tight means that the above mentioned leakage flow between 0 to 5 slm, or less than 3 slm, or more preferably less than 1 slm.

Preferably, the precursor supply cabinet comprises two or more separate gas tight precursor supply chambers arranged spaced apart from each other inside the inner cabinet space of the precursor supply cabinet such that one or more flow gaps is provided between the two or more separate gas tight precursor supply chambers.

This allows the ventilation gas to flow between the two or more precursor supply chambers. Thus, the two or more precursor supply chambers may be kept separated from each, and especially they may be thermally separated from each other. Temperature inside the two or more precursor supply chambers may differ from each other, as thus it is advantageous that the heat transfer between the precursor supply chambers inside the precursor supply cabinet is minimized.

In another embodiment, the precursor supply cabinet comprises two or more gas tight precursor supply chambers arranged together or against each other inside the inner cabinet space. Thus, there is no flow gaps between the two or more gas tight precursor supply chambers. Further, one precursor supply chamber may comprise or formed to provide two or more separate inner chambers spaces defined by chamber walls. In these embodiment, the inner cabinet space of the precursor supply cabinet surrounding the two or more together arranged gas tight precursor supply chambers is ventilated.

In one embodiment, the precursor supply cabinet comprises two or more separate gas tight precursor supply chambers. At least two of the two or more separate gas tight precursor supply chambers are arranged adjacent to each other inside the inner cabinet space of the precursor supply cabinet, and at a first distance from each other such that a first flow gap is formed between the adjacent gas tight precursor supply chambers.

In another embodiment, the precursor supply cabinet comprises two or more separate gas tight precursor supply chambers. At least two of the two or more separate gas tight precursor supply chambers are arranged one on top of the other inside the inner cabinet space of the precursor supply cabinet, and at a second distance from each other such that a second flow gap is formed between the adjacent gas tight precursor supply chambers.

In yet another embodiment, the precursor supply cabinet comprises two or more separate gas tight precursor supply chambers. At least two of the two or more separate gas tight precursor supply chambers are arranged adjacent to each other inside the inner cabinet space of the precursor supply cabinet, and at a first distance from each other such that a first flow gap is formed between the adjacent gas tight precursor supply chambers, and at least two of the two or more separate gas tight precursor supply chambers are arranged one on top of the other inside the inner cabinet space of the precursor supply cabinet, and at a second distance from each other such that a second flow gap is formed between the adjacent gas tight precursor supply chambers.

Accordingly, the separate precursor supply chambers may be arranged spaced apart from each other in vertical and/or horizontal direction such that flow gaps and formed between the separate precursor supply chambers. Thus, the ventilation gas may flow in every direction between the separate precursor supply chambers.

In one embodiment, the two or more separate gas tight precursor supply chambers are arranged spaced apart from the cabinet walls inside the inner cabinet space of the precursor supply cabinet such that flow gaps are provided between the two or more separate gas tight precursor supply chambers and the cabinet walls.

Thus, the ventilation gas may flow inside the inner cabinet space between the precursors supply chambers and the cabinet walls such that the precursor supply chambers may be ventilated and thermally separated from the cabinet walls. Further, the precursor supply chambers may be ventilated on all sides.

In another embodiment, at least two of the one or more separate gas tight precursor supply chambers is arranged to one of the cabinet walls inside the inner cabinet space of the precursor supply cabinet and spaced apart from other cabinet walls such that the flow gaps are provided between the at least one of the two or more separate gas tight precursor supply chambers and the other cabinet walls. This allows providing ventilation on all other sides or cabinet walls of the precursor supply chamber except the one that is arranged on the cabinet wall or against the cabinet wall.

In one embodiment, the ventilation discharge connection comprises a ventilation outlet provided to the cabinet walls and open to the inner cabinet space of the precursor supply cabinet, and a suction device connected to the ventilation outlet and arranged to discharge ventilation gas from the inner cabinet space of the precursor supply cabinet via the ventilation outlet.

The ventilation outlet may comprise an outlet opening and an outlet channel extending from the outlet opening.

Accordingly, the ventilation gas flow inside the inner cabinet space and through the inner cabinet space is achieved by providing a suction to the inner cabinet space via the ventilation outlet. The suction power may be form example more than 50 cubic meter of ventilation gas per hour, or more than 100 cubic meters of ventilation gas per hour.

In one embodiment, the precursor supply cabinet comprises a top cabinet wall and the ventilation outlet is provided to the top cabinet wall.

In this embodiment, the outlet opening may be provided to the top cabinet wall such that the ventilation may be discharged from the inner cabinet space from via the top wall or the upper part of the inner cabinet space.

In one embodiment, the one or more ventilation inlet connections comprises a ventilation inlet open to the inner cabinet space of the precursor supply cabinet and arranged to provide ventilation gas into the inner cabinet space of the precursor supply cabinet.

Therefore, the ventilation discharge connection or the suction device provides a suction or under pressure to the inner cabinet space causing the ventilation gas to enter the inner cabinet space via the one or more ventilation inlets. The ventilation inlet may comprise an inlet opening open to the inner cabinet space. The inlet opening may in some embodiment be open to the atmosphere surrounding the precursor supply cabinet such that the ventilation gas or air is taken from the surrounding atmosphere. The ventilation inlet connection may also comprise an inlet channel in connection with the inlet opening.

In one embodiment, the one or more ventilation inlet connections comprises a regulator element provided to the ventilation inlet and arranged to adjust the ventilation inlet for adjusting the ventilation gas flow into the inner cabinet space of the precursor supply cabinet via the ventilation inlet.

The regulator element may be terminal element or an adjustment element arranged to adjust the inflow of the ventilation gas into the inner cabinet space. In some embodiment, the regulator element is arranged to adjust size of the inlet opening or inlet channel. Adjusting the size of the inlet opening or channel may adjust the flow velocity of the ventilation into and inside the inner cabinet space.

In one embodiment, the precursor supply cabinet comprises one or more cabinet doors, and the one or more ventilation inlet connections are arranged to the one or more cabinet doors.

Arranging the ventilation inlet connection or inlet opening to the cabinet doors is advantageous as opening a door causes majority of the ventilation gas to enter the inner cabinet space through the open door such that gas flow out of the inner cabinet space is prevented. The inflow of ventilation gas via the other inlet opening in closed doors is decreased at the same time. Further, arranging the ventilation inlet connections to the cabinet doors removes need for making openings to the cabinet walls.

In one embodiment, the two or more separate gas tight precursor supply chambers comprises a chamber door aligned with the one or more cabinet doors.

In another embodiment, each of the two or more separate gas tight precursor supply chambers comprises a chamber door and the precursor supply cabinet comprises a respective separate cabinet door opposite each the two or more separate gas tight precursor supply chambers.

In yet another embodiment, the two or more separate gas tight precursor supply chambers are arranged aligned with the two or more cabinet doors. This means that the two or more precursor supply chambers are arranged opposite or behind the two or more cabinet doors.

In a still further embodiment, the precursor supply cabinet comprises a separate cabinet door opposite each the two or more separate gas tight precursor supply chambers such that each separate cabinet door is aligned with a respective separate gas tight precursor supply chamber. This means that behind or opposite each cabinet door there is a precursor sully chamber aligned inside the inner cabinet space.

Accordingly, opening one cabinet door provides increased ventilation gas flow into the inner cabinet space via the opened cabinet door towards the precursor supply chamber aligned with the opened cabinet door. Thus, enhanced safety is achieved as ventilation of the precursor supply chamber opposite or behind the opened cabinet door is increased.

In one embodiment, the precursor supply cabinet comprises a gas tight lead-through connection extending inside the inner cabinet space of the precursor supply cabinet between the precursor supply chamber and the cabinet walls of the precursor supply cabinet.

Accordingly, each of the two or more precursor supply chambers comprises the gas tight lead-through connection extending from the precursor supply chamber to the cabinet wall for supplying precursors gas from the precursor supply chamber. The gas tight precursor supply connection is open to the inner chamber space of the precursor supply chamber and outside the precursor supply cabinet.

In one embodiment, the separate gas tight precursor supply chamber is arranged spaced apart from one cabinet wall inside the inner cabinet space of the precursor supply cabinet such that the flow gap is provided between the separate gas tight precursor supply chamber and the one cabinet wall. The gas tight lead-through connection is arranged to extend inside the inner cabinet space of the precursor supply cabinet between the precursor supply chamber and the one cabinet wall across the flow gap between the separate gas tight precursor supply chamber and the one cabinet wall.

Accordingly, the gas tight lead-through extends across the flow gap between the precursor supply chamber and the cabinet wall. The lead through connection is provided gas tight such that there is substantially no gas flow between the inner space of the lead-through connection and the outside of the lead-through connection. Accordingly, gas tight means in relation to the lead-through connection that leakage flow is less than 5 standard litre per minute (slm) into the inner space of the lead-through connection from outside of the lead-through connection, or between the inner space and the outside of the lead-through connection. Preferably, the gas tight means that the above mentioned leakage flow is between 0 to 5 slm, or less than 3 slm, or more preferably less than 1 slm. The lead-through connection may be preferably provided vacuum tight for forming a vacuum tight precursor connection. Vacuum tight means that the leakage flow is less than 0.5 slm or less than 0.1 slm or preferably the leakage is substantially 0 slm.

In one embodiment, at least one of the flow gaps a flow guide for adjusting ventilation gas flow.

In another embodiment, at least one of the flow gaps between the two or more separate gas tight precursor supply chambers comprise a flow guide for adjusting ventilation gas flow between the two or more separate gas tight precursor supply chambers.

In a further embodiment, at least one of the flow gaps between the one or more separate gas tight precursor supply chambers and the cabinet walls comprises a flow guide for adjusting ventilation gas flow between the two or more separate gas tight precursor supply chambers and the cabinet walls.

In a yet alternative embodiment, at least one of the flow gaps between the two or more separate gas tight precursor supply chambers comprises a flow guide for adjusting ventilation gas flow between the two or more separate gas tight precursor supply chambers and at least one of the flow gaps between the one or more separate gas tight precursor supply chambers and the cabinet walls comprises a flow guide for adjusting ventilation gas flow between the two or more separate gas tight precursor supply chambers and the cabinet walls.

The flow guide may adjust the flow direction of the ventilation gas and/or flow velocities or flow amounts in different flow gaps. Thus, the ventilation gas flow through the cabinet inner space may be provided in efficient manner.

In one embodiment, the precursor supply cabinet comprises a gas panel box provided outside the inner cabinet space. The gas panel box comprises panel box walls defining a panel box inner space, gas connections provided inside the panel box inner space for supplying gaseous precursor gases, gas panel ventilation inlet connection provided to the panel box walls and arranged to provide ventilation gas into the inner panel box space. The gas panel box is connected to the ventilation discharge connection of the precursor supply cabinet for discharging ventilation gas from the panel box inner space gas panel box.

Accordingly, the ventilation discharge connection is connected gas panel box such that the ventilation gas may be discharged from the panel box inner space together with the ventilation gas from the cabinet inner space. This provides simple and efficient structure for the precursor supply cabinet.

In one embodiment, the ventilation outlet comprises an outlet channel open to the inner cabinet space and extending through the panel box inner space and the outlet channel comprises panel box outlet opening provided to the outlet channel inside the panel box inner space.

In another embodiment, the ventilation outlet comprises an outlet channel open to the inner cabinet space and connected to the panel box inner space with a panel box outlet channel open to the panel box inner space.

Accordingly, the outlet channel is utilized to discharge ventilation gas from the precursor supply cabinet and also from the panel box.

In one embodiment, the two or more separate gas tight precursor supply chambers comprise a heating element for heating inner chamber space of the two or more separate gas tight precursor supply chambers.

In another embodiment, the two or more separate gas tight precursor supply chambers comprise a heating element provided inside inner chamber space of the two or more separate gas tight precursor supply chambers for heating inner chamber space of the separate gas tight precursor supply chambers.

Accordingly, the precursor container and thus the precursor may be heated inside the gas tight precursor supply chamber and precursor supply chamber is arranged in the ventilated inner cabinet space of the precursor supply cabinet. Thus, the ventilation does not affect the heating of the precursor container.

An advantage of the invention is that the precursor containers may be arranged into a ventilated space inside the precursor supply cabinet without subjecting the precursor containers to ventilation gas flow. Thus, the temperature of the precursors may be controlled in great detail as the ventilation gas flow does not affect the temperature and is not in contact with the precursor container. Further, the precursor containers in the separate gas tight precursor supply chambers are thermally separated from each other and from the precursor supply cabinet such that the different temperatures of the different precursor supply chambers and containers do not affect to each other due to the ventilation gas flow.

BRIEF DESCRIPTION OF THE DRAWINGS

The invention is described in detail by means of specific embodiments with reference to the enclosed drawings, in which.

DETAILED DESCRIPTION OF THE INVENTION

Figure 1:
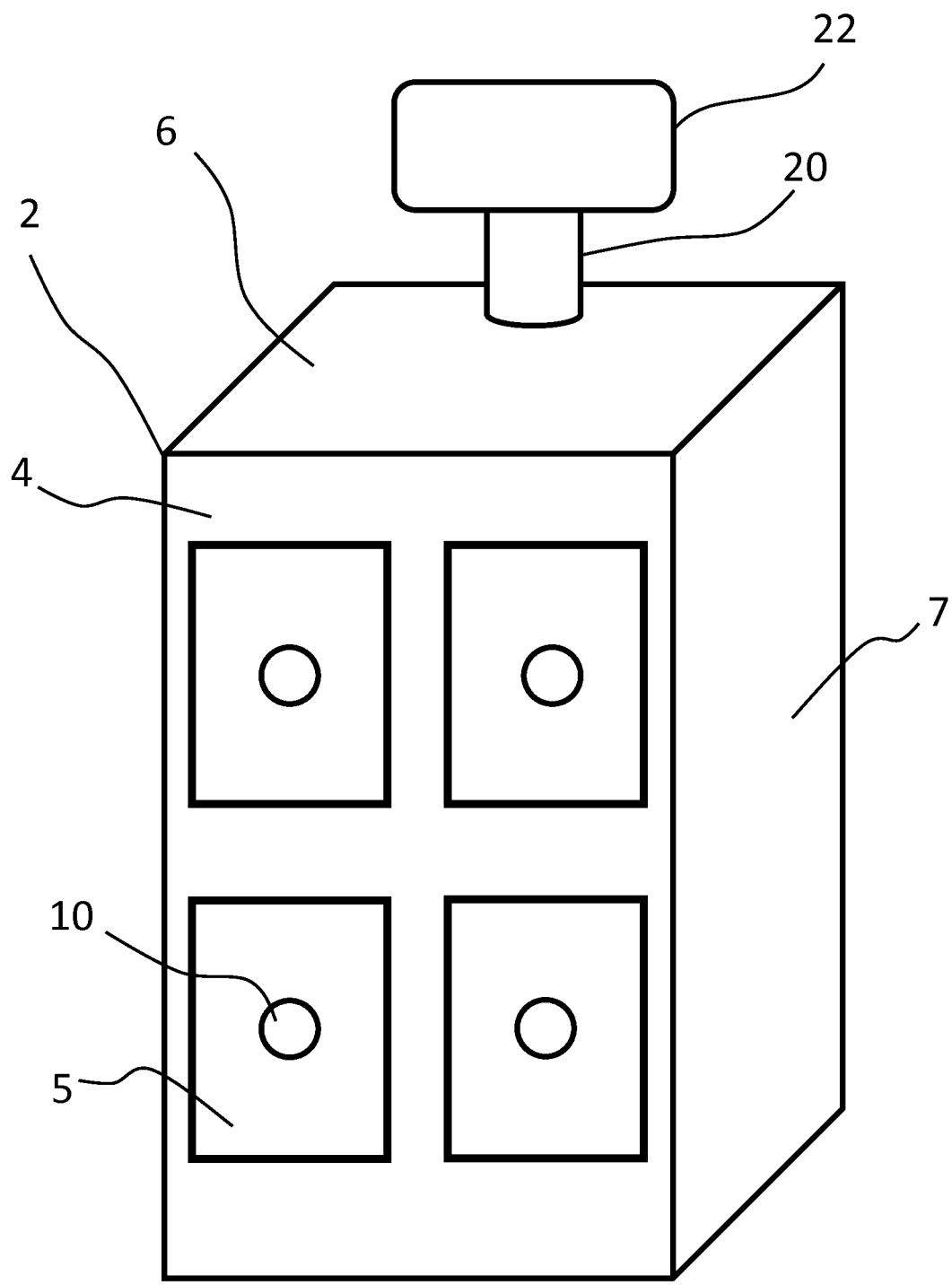
FIGS. 1, 2 and 3 show schematically embodiments of a precursor supply cabinet according to the present invention.

FIG. 1 shows a precursor supply cabinet 2 for an atomic layer deposition apparatus or atomic layer deposition reactor. The precursor supply cabinet 2 is arranged to accommodate one or more precursor containers from which the precursors are supplied to the atomic layer deposition reactor and especially to a reaction chamber of the atomic layer deposition reactor for processing a substrate.

The precursor supply cabinet 2 comprises cabinet walls 3, 4, 6, 7, 8, 9 defining an inner cabinet space 1 inside the precursor supply cabinet 2. Accordingly, the cabinet walls 3, 4, 6, 7, 8, 9 form the body of the precursor supply cabinet 2.

The precursor supply cabinet 2 further comprises one or more doors 5 which may be arranged in open position and closed position for providing access to the inner cabinet space 1 and for closing the inner cabinet space 1.

In the embodiment of FIG. 1, the cabinet doors 5 are provided to a cabinet front side wall 4 of the precursor supply cabinet 2.

However, the cabinet doors 5 may alternatively be provided to other cabinet side walls 3, 7, 9 or to top cabinet wall 6 or bottom cabinet wall 8. Further, the precursor supply cabinet 2 may comprise one or more cabinet doors 5 on two or more cabinet walls 3, 4, 6, 7, 8, 9.

The precursor supply cabinet 2 comprises one or more ventilation inlet connections 10 arranged to provide ventilation gas into the inner cabinet space 1 of the precursor supply cabinet 2. The ventilation gas inlet connections 10 provides access or inflow path between outside of the precursor supply cabinet to inside the inner cabinet space 1 such that ventilation gas may flow into the inner cabinet space 1 from outside the precursor supply cabinet 2.

In the embodiment of FIG. 1 the ventilation inlet connections 10 are provided to the cabinet doors 5.

Figure 2:
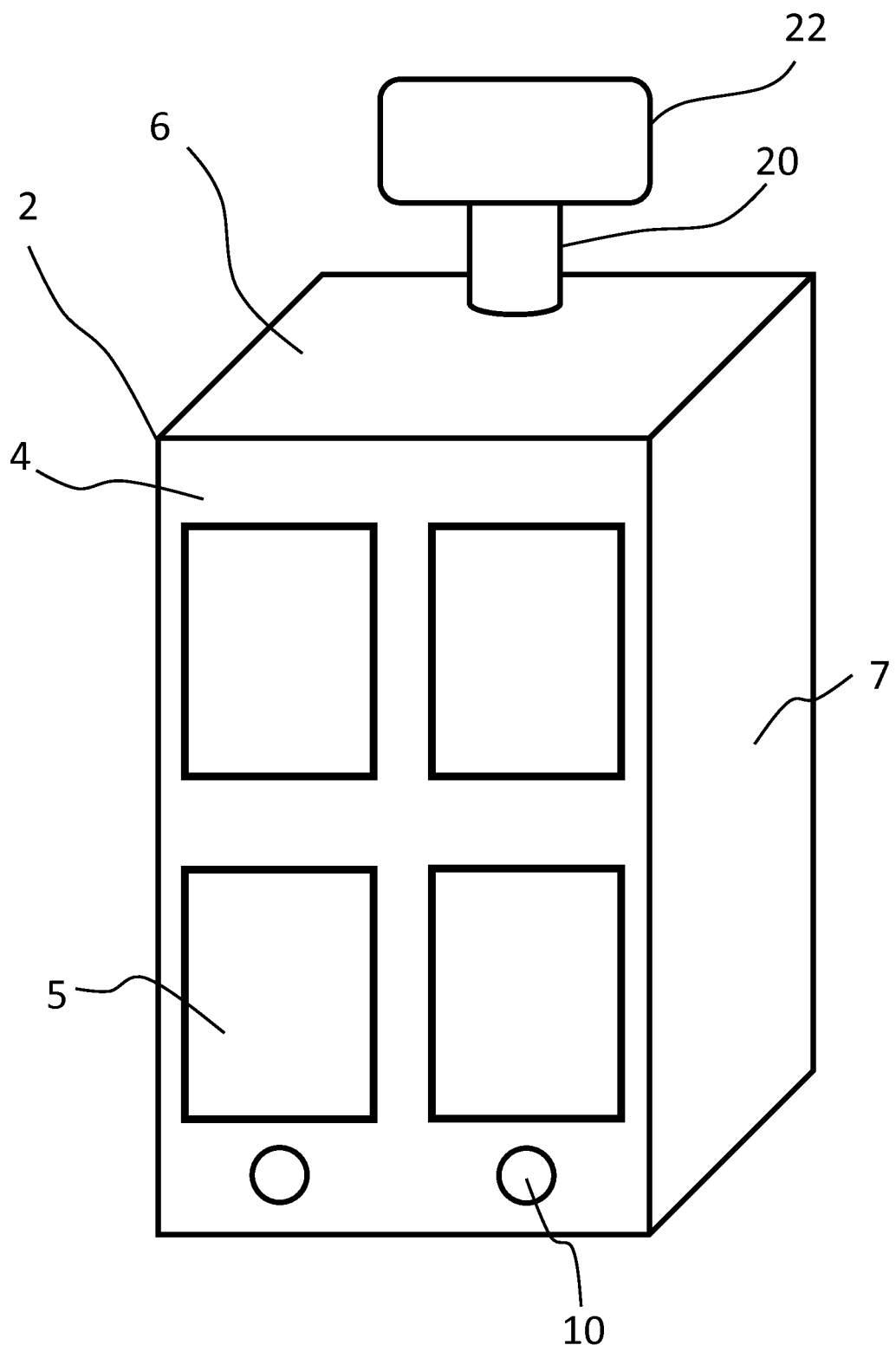

In the embodiment of FIG. 2, the ventilation inlet connections 10 are provided to the cabinet front side wall 4.

However, it should be noted that the ventilation inlet connections 10 may be provided to any of the chamber walls 3, 4, 6, 7, 8, 9 or two or more of the cabinet walls 3, 4, 6, 7, 8, 9.

The one or more ventilation inlet connections 10 comprises a ventilation inlet 10 open to the inner cabinet space 1 of the precursor supply cabinet 2 and arranged to provide ventilation gas into the inner cabinet space 1 of the precursor supply cabinet 100.

The ventilation inlet 10 may be further open to the surrounding atmosphere around the precursor supply cabinet 2 such that the ventilation gas or ventilation air may enter the inner cabinet space 1 via the ventilation inlet 10.

The ventilation inlet 10 may be a ventilation inlet opening or ventilation inlet channel or the like proving inlet flow path for the ventilation gas.

It should be noted, that in some embodiments the ventilation inlet 10 may be connected to a ventilation gas source (not shown) for providing inflow of ventilation gas into the inner cabinet space 1. The ventilation gas source may be any suitable gas source. Thus, in this embodiment, the ventilation gas is not taken from the atmosphere surrounding the precursor supply cabinet.

Figure 12:
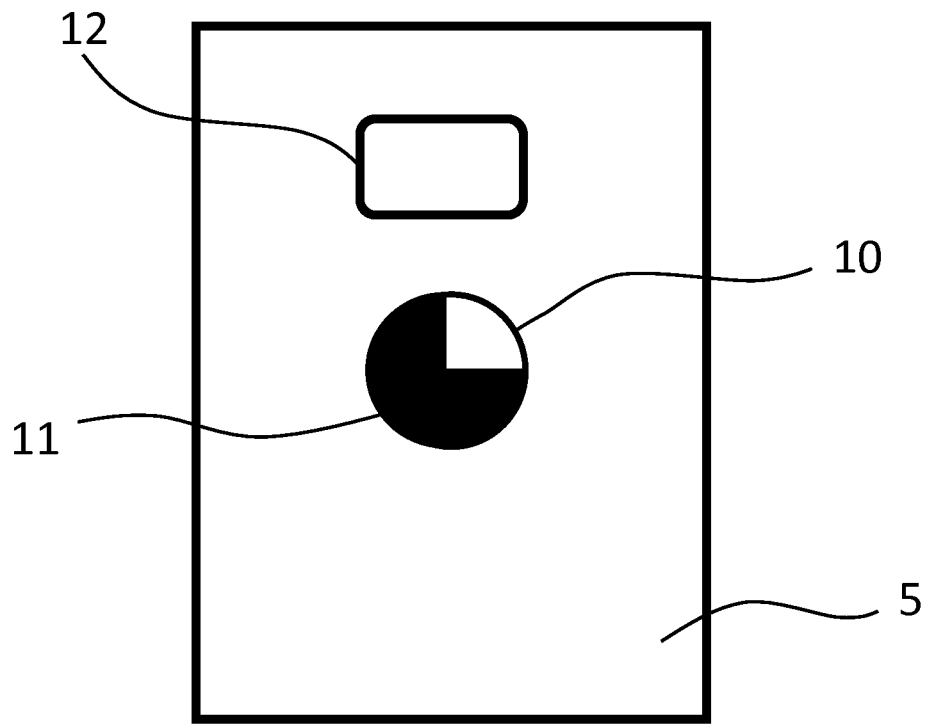
FIG. 12 shows schematically one embodiment of the cabinet door.

FIG. 12 shows one cabinet door 5 in greater detail. The cabinet door 5 comprises on opening and closing mechanism, such as hinge or the like (not shown) for opening and closing the cabinet door 5. The cabinet door 5 may also comprise a locking mechanism for securing or locking the cabinet door 5 to the closed position. The cabinet door 5 is further provided with a cabinet door window 12 for providing visual contact inside the inner cabinet space 1.

As shown in FIG. 12, the ventilation inlet connection 10 may also comprise a regulator element 11 provided to the ventilation inlet 10. The regulator element 11 is arranged to adjust the ventilation inlet 10 for adjusting the ventilation gas flow into the inner cabinet space 1 of the precursor supply cabinet 100 via the ventilation inlet 10. The regulator element 11 may be arranged to adjust the flow part provided by the ventilation inlet 10, or the ventilation inlet opening or channel. Accordingly, the regulator element 11 may be arranged to adjust the size of the inlet opening 10 or cross sectional area of the inlet channel 10.

The regulator element 11 may be any know terminal element or an adjustment element arranged to adjust the inflow of the ventilation gas into the inner cabinet space 1.

The regulator element 11 may be provided to all ventilation inlet connections 10 or to only some of them. Furthermore, the regulator element 11 may be provided to ventilation inlet connections 10 which are arranged to cabinet door 5 or to cabinet wall 3, 4, 6, 7, 8, 9.

The precursor supply cabinet 2 comprises one or more ventilation discharge connections 20, 22 arranged to discharge ventilation gas from the inner cabinet space 1 of the precursor supply cabinet 2. The ventilation discharge connection 20, 22 provides access to the inner cabinet space 1 and an outflow path for the ventilation gas for discharging ventilation gas out from the inner cabinet space 1.

The ventilation discharge connection 20, 22 is provided to the cabinet walls 3, 4, 6, 7, 8, 9. Thus the ventilation gas may be discharged through the cabinet walls 3, 4, 6, 7, 8, 9.

Figure 4:
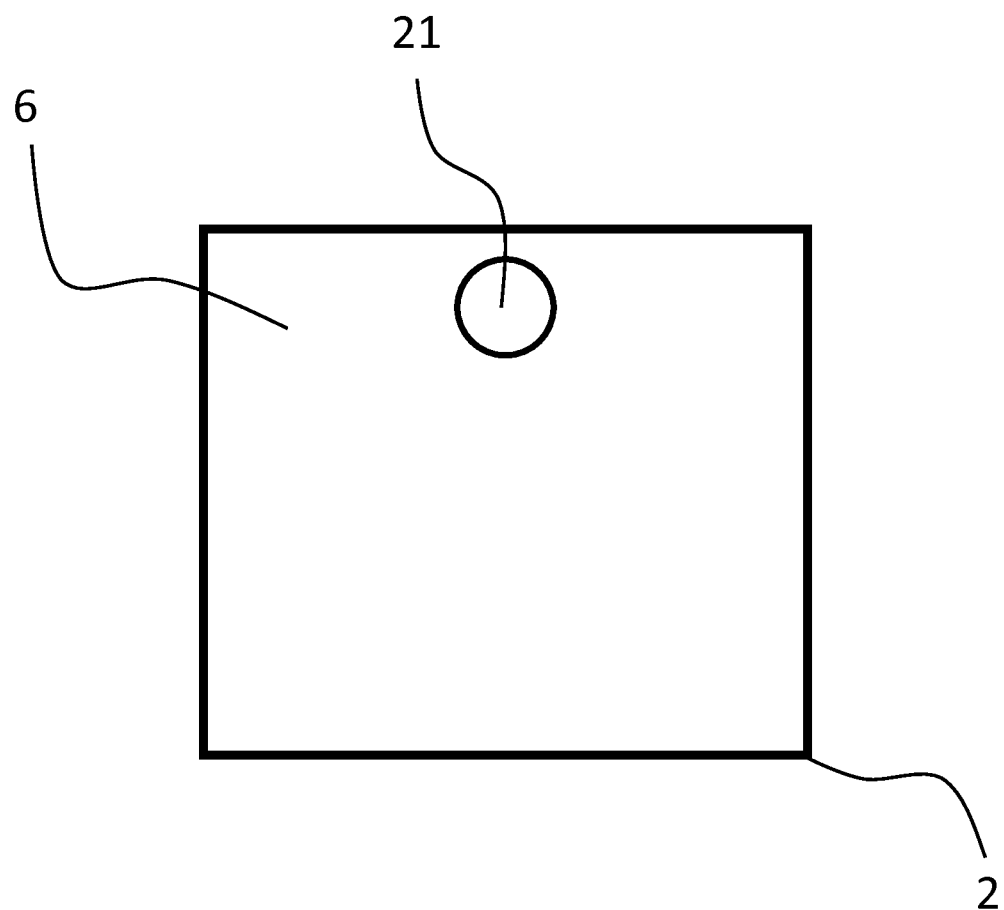
FIG. 4 shows schematic top view of a precursor cabinet of any of the FIGS. 1, 2 and 3.

In the embodiment, of FIGS. 1 and 2, the ventilation discharge connection 20, 22 is provided to the top cabinet wall 6, as shown in FIG. 4. The ventilation discharge connection comprises an outlet opening 21 open to the inner cabinet space 1. The ventilation outlet channel 20 extends from the outlet opening 21.

However, the ventilation discharge connection 20, 22 may be alternatively provided to any other cabinet wall 3, 4, 7, 8, 9 or there may be one or more ventilation discharge connections 20, 22 in two or more cabinet wall 3, 4, 6, 7, 8, 9.

The ventilation discharge connection 20, 22 comprises a ventilation outlet 20 provided to the cabinet walls 3, 4, 6, 7, 8, 9 and open to the inner cabinet space 1 of the precursor supply cabinet 2. The ventilation outlet 20 may be a ventilation outlet opening 20 or a ventilation outlet channel or the like proving outlet flow path for the ventilation gas.

The ventilation discharge connection further comprises a suction device 22 connected to the ventilation outlet 21 or the outlet channel 20 and arranged to discharge ventilation gas from the inner cabinet space 1 of the precursor supply cabinet 2 via the ventilation outlet 20.

The suction device 22 may be vacuum pump or the like device capable of discharging ventilation gas from the inner cabinet space 1 via the ventilation outlet 20. The suctions device 20 also provides ventilation gas inflow into the inner cabinet space 1 via the ventilation inlet connections 10.

The suction device 22 is arranged to provide ventilation gas flow to the precursor supply cabinet which is at least 25 cubic meters per hour, or at least 50 cubic meter per hour, or 50 to 100 cubic meters per hour, or at least 100 cubic meter per hour of ventilation gas.

The ventilation discharge connection 20, 22, or the ventilation outlet 20, and the ventilation inlet connections 10, or the ventilation inlets 10, are preferably arranged on different cabinet walls 3, 4, 6, 7, 8, 9 of the precursor supply cabinet 10. Further, the ventilation discharge connection 20, 22, or the ventilation outlet 20, and the ventilation inlet connections 10, or the ventilation inlets 10, are preferably arranged at distance from each other in the precursor supply cabinet 2 such that the ventilation gas may flow through the whole inner cabinet space 1.

Figure 3:
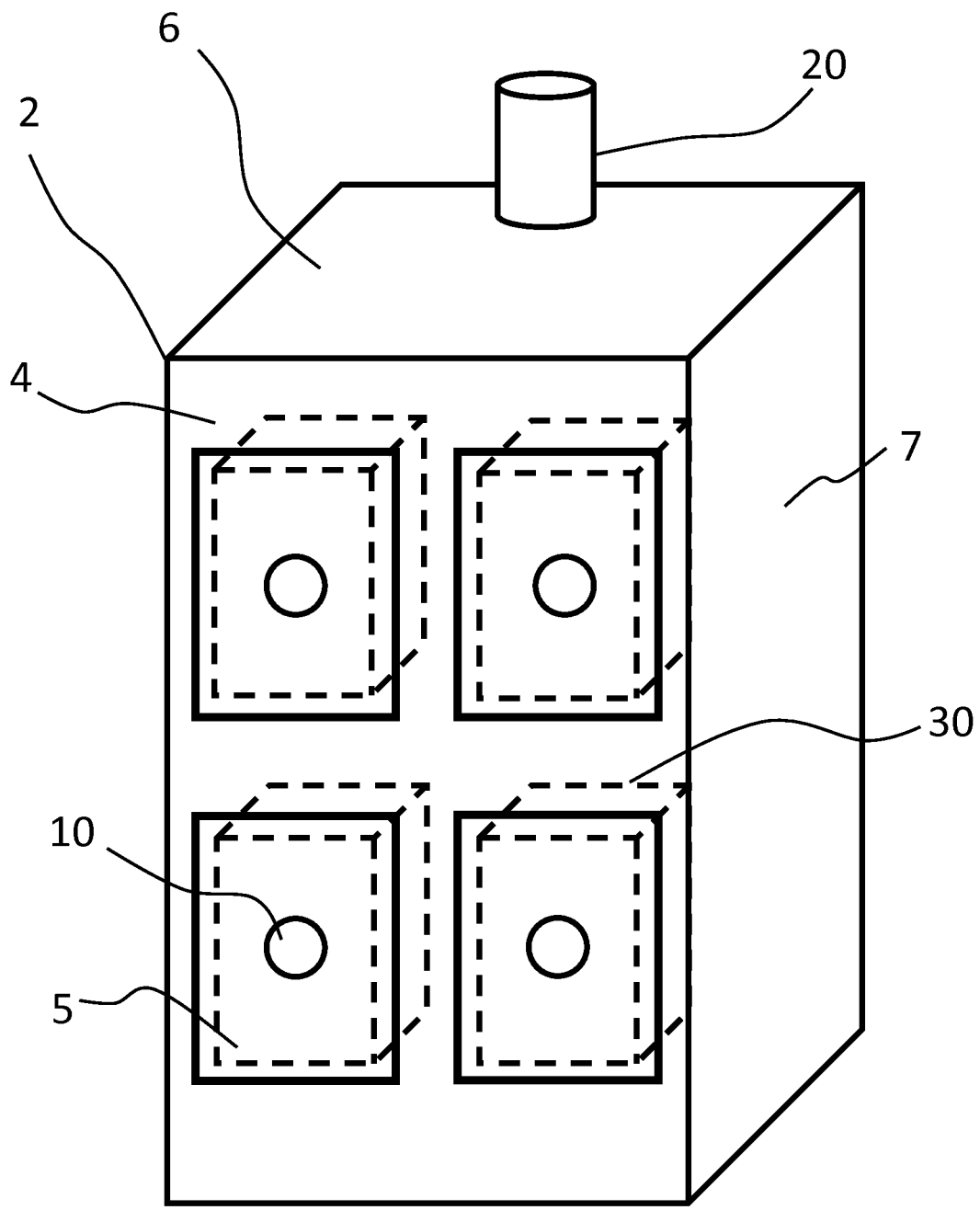

The precursor supply cabinet 2 further comprises one or more, preferably two or more, separate gas tight precursor supply chambers 30 for accommodating precursor containers 80, as shown in FIG. 3. The one or more gas tight precursor supply chambers 30 are arranged inside the inner cabinet space 1 of the precursor supply cabinet 2, as shown in FIG. 3.

The two or more gas tight precursor supply chambers 30 are arranged inside the inner cabinet space 1 such that the inner cabinet space 1 of the precursor supply cabinet 2 surrounds the two or more separate gas tight precursor supply chambers 30 and thus the inner cabinet space 1 of the precursor supply cabinet 2 surrounding the two or more separate gas tight precursor supply chambers 30 is ventilated. Thus, the two or more precursor supply chambers 30 are arranged in ventilated inner cabinet space 1 surrounding the two or more precursor supply chambers 30.

Figure 5:
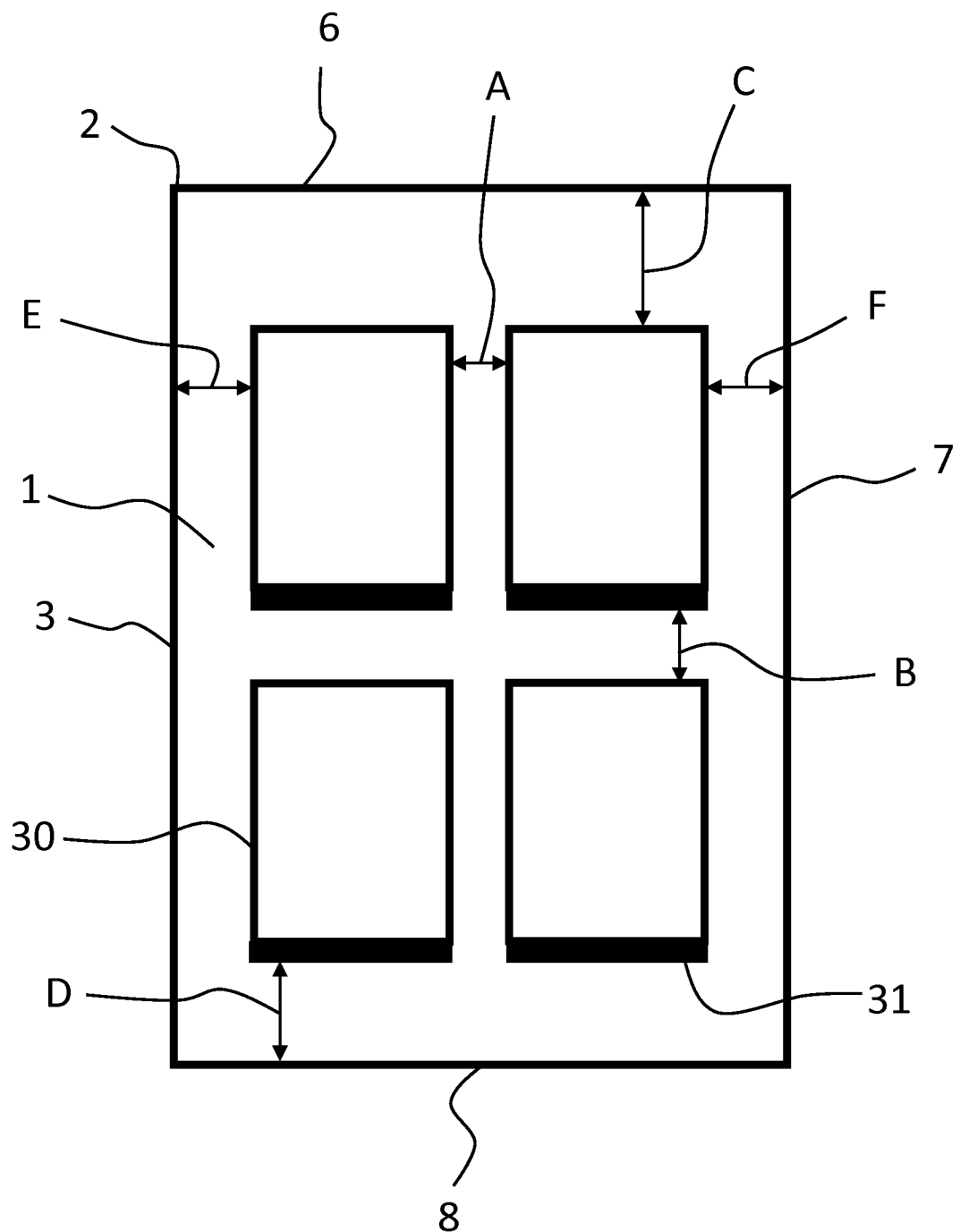
FIGS. 5 and 6 show schematically one embodiment of an arrangement of separate precursor supply chambers in the inner cabinet space.

FIG. 5 shows one embodiment of the present invention and arrangement of the precursor supply chambers 30 inside the inner chamber space 1 when viewed from the front side wall 4 of the precursor supply cabinet 2, meaning from the direction of the cabinet doors 5.

Inside the inner cabinet space 1 the two or more precursor supply chambers 30 are placed or arranged to rack(s) 31 or shelves provided inside the inner cabinet space 1 for supporting the one or more precursor supply chambers 30.

Figure 6:
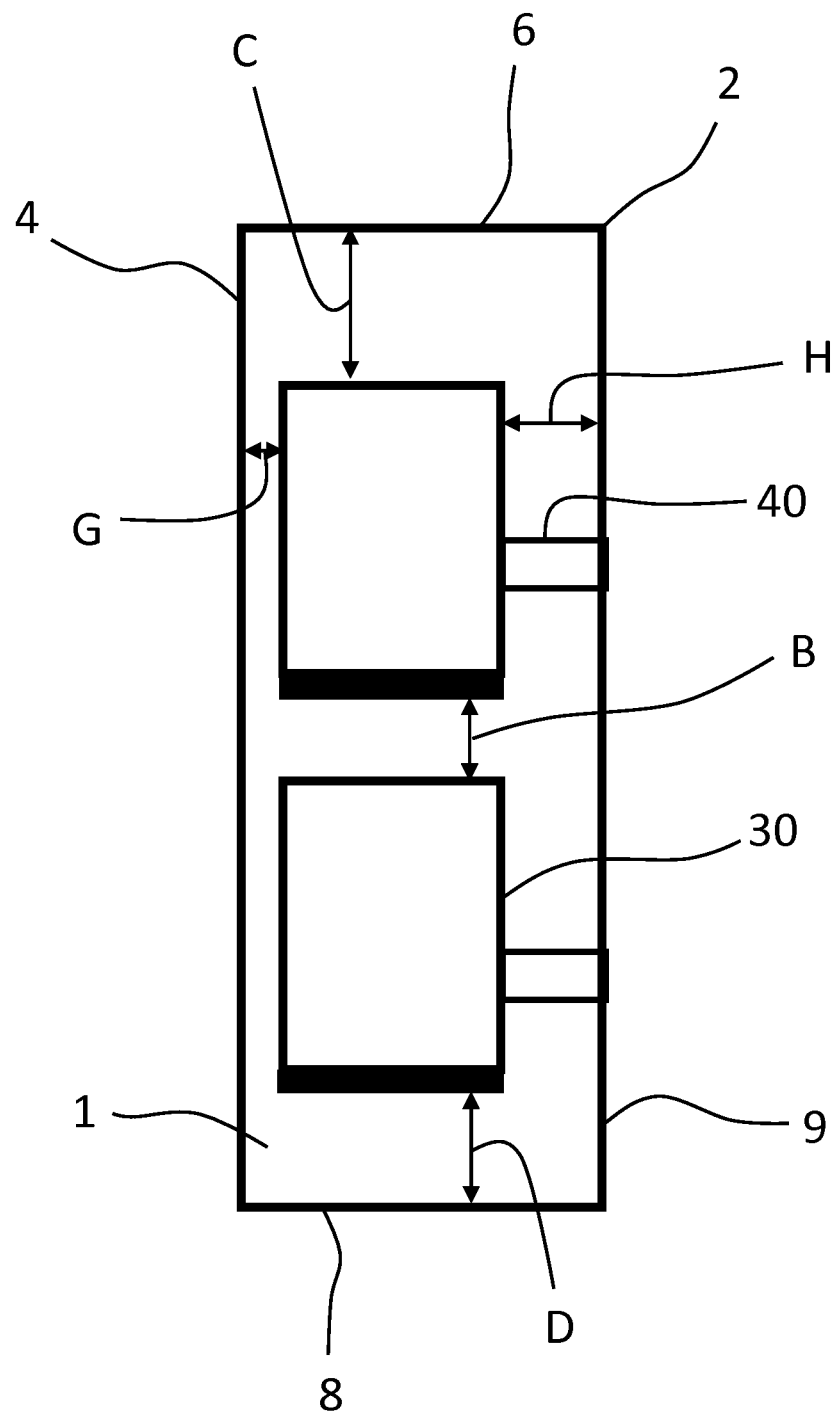

As shown in FIGS. 5 and 6, there are four precursor supply chambers 30 arranged adjacent to each other and superposed, or one top of another. In FIG. 5, there are two adjacent precursor supply chambers 30 in a row and two superposed precursor supply chambers 30 in a column. However, it should be noted that the present invention is not limited to any number or arrangement of the precursor supply chambers 30.

The separate gas tight precursor supply chambers 30 are arranged spaced apart from each other inside the inner cabinet space 1 of the precursor supply cabinet 2 such that one or more flow gaps A, B is provided between the two or more separate gas tight precursor supply chambers 30. The flow gaps A, B extend between the adjacent or superposed precursor supply chambers 30 such that the precursor supply chambers at a distance or distances defined by the flow gaps A, B from adjacent and/or superposed precursor supply chambers 30.

The flow gaps A, B between the precursor supply chambers 30 enable ventilation gas flow between the separate precursor supply chambers 30.

Accordingly, at least two of the two or more separate gas tight precursor supply chambers 30 are arranged adjacent to each other inside the inner cabinet space 1 of the precursor supply cabinet 2, and at a first distance from each other such that a first flow gap A is formed between the adjacent gas tight precursor supply chambers 30, as shown in FIGS. 5 and 6.

Similarly, at least two of the two or more separate gas tight precursor supply chambers 30 are arranged one on top of the other inside the inner cabinet space 1 of the precursor supply cabinet 2, and at a second distance from each other such that a second flow gap B is formed between the adjacent gas tight precursor supply chambers 30.

In the embodiment, of FIG. 5, at least two of the two or more separate gas tight precursor supply chambers 30 are arranged adjacent to each other inside the inner cabinet space 1 of the precursor supply cabinet 2, and at a first distance from each other such that a first flow gap A is formed between the adjacent gas tight precursor supply chambers 30. Furthermore, at least two of the two or more separate gas tight precursor supply chambers 30 are arranged one on top of the other inside the inner cabinet space 1 of the precursor supply cabinet 2, and at a second distance from each other such that a second flow gap B is formed between the adjacent gas tight precursor supply chambers 30.

However, in an alternative embodiment, two or more precursor supply chambers 30 may be arranged together or against each other such that there is no flow gap between these precursor supply chambers 30. Thus, these precursor supply chambers 30 arranged together form one unit which is inside the ventilated inner cabinet space 1.

The two or more separate gas tight precursor supply chambers 30 further are arranged spaced apart from the cabinet walls 3, 4, 6, 7, 8, 9 inside the inner cabinet space 1 of the precursor supply cabinet 2 such that flow gaps C, D, E, F, G, H are provided between the two or more separate gas tight precursor supply chambers 30 and the cabinet walls 3, 4, 6, 7, 8, 9.

As shown in FIGS. 5 and 6, the precursor supply chambers 30 are arranged in vertical direction at a distance or distances C, D from the cabinet walls 6, 8, meaning the top wall 6 and the bottom wall 8, respectively. Thus, flow gaps C, D are formed between the precursor supply chambers 30 and the top wall 6 and bottom wall 8, respectively.

The precursor supply chambers 30 are also arranged in horizontal direction at a distance or distances E, F from the cabinet walls 3, 7, meaning the side walls 3, 7, respectively. The precursor supply chambers 30 are further arranged in horizontal direction at a distance or distances E, F from the cabinet walls 3, 7, meaning the side walls 3, 7, respectively. Thus, flow gaps E, F are formed between the precursor supply chambers 30 and the first wall 3 and second wall 7, respectively.

The precursor supply chambers 30 are also arranged in horizontal direction at a distance or distances G, H from the cabinet walls 4, 9, meaning the front wall 4 and the back wall 9, respectively. The precursor supply chambers 30 are further arranged in horizontal direction at a distance or distances G, H from the cabinet walls 4, 9, meaning the front wall 4 and back wall 9, respectively. Thus, flow gaps G, H are formed between the precursor supply chambers 30 and the front wall 4 and back wall 9, respectively.

According to the above mentioned, the precursor supply chambers 30 are spaced apart from the cabinet walls such that ventilation gas may flow between the cabinet walls 3, 4, 6, 7, 8, 9 and the precursor supply chambers 30. Thus, the precursor supply chambers 30 may be ventilated from all sides and all directions.

In an alternative embodiment, at least one of the two or more separate gas tight precursor supply chambers 30 is arranged to one of the cabinet walls 3, 4, 6, 7, 8, 9 inside the inner cabinet space 1 of the precursor supply cabinet 2 and spaced apart from other cabinet walls 3, 4, 6, 7, 8, 9 such that the flow gaps C, D, E, F, G, H are provided between the at least one of the two or more separate gas tight precursor supply chambers 30 and the other cabinet walls 3, 4, 6, 7, 8, 9. Accordingly, the precursor supply chamber 30 may be arranged against or on one cabinet wall 3, 4, 6, 7, 8, 9 inside the inner cabinet space 1. In this case, the precursor supply chamber 30 is ventilated on all other sides except the on the one side of the cabinet wall against which the precursor supply chamber 30 is arranged.

Figure 7:
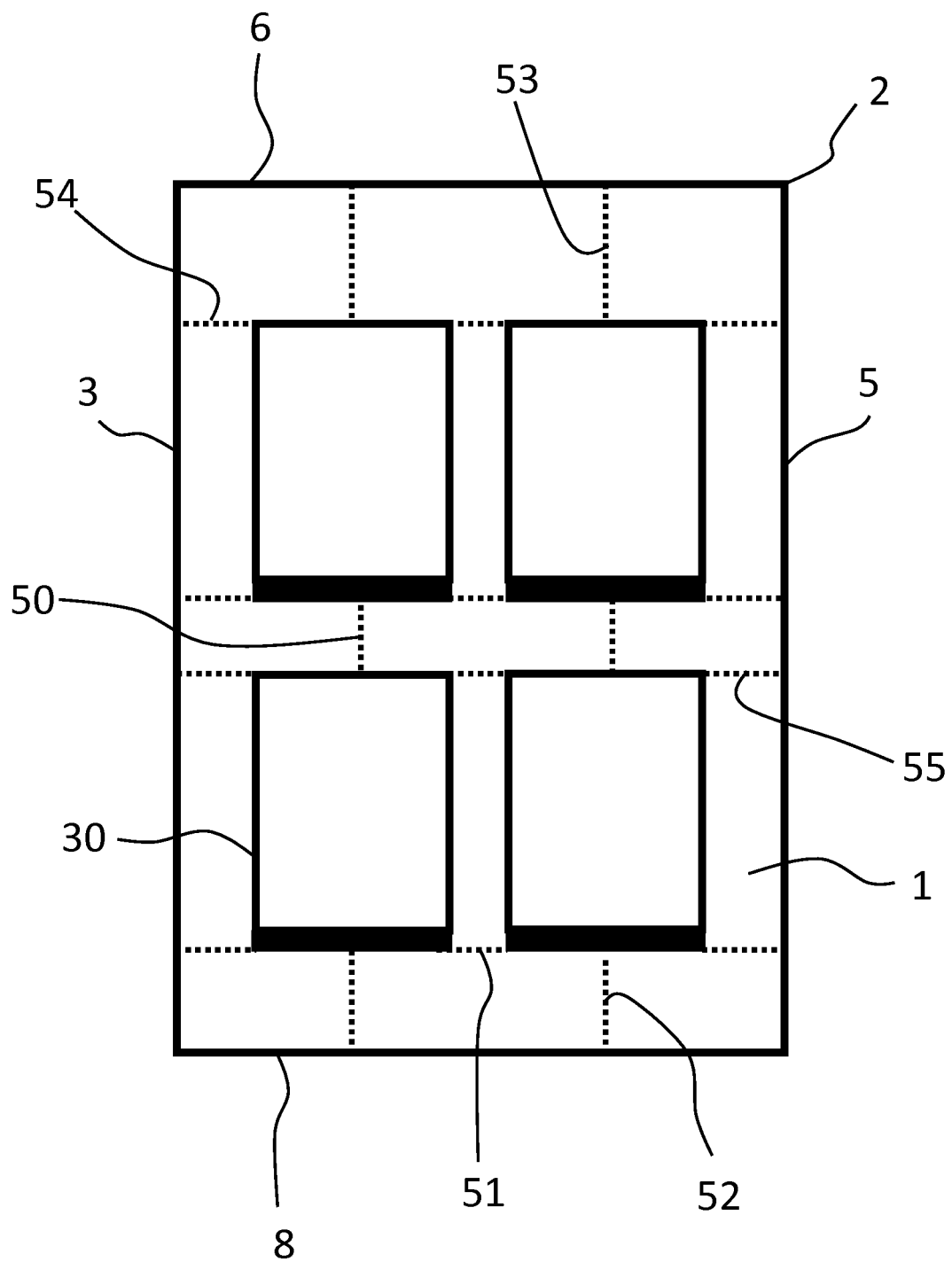
FIGS. 7 and 8 show schematically another embodiment of an arrangement of separate precursor supply chambers in the inner cabinet space.
Figure 8:
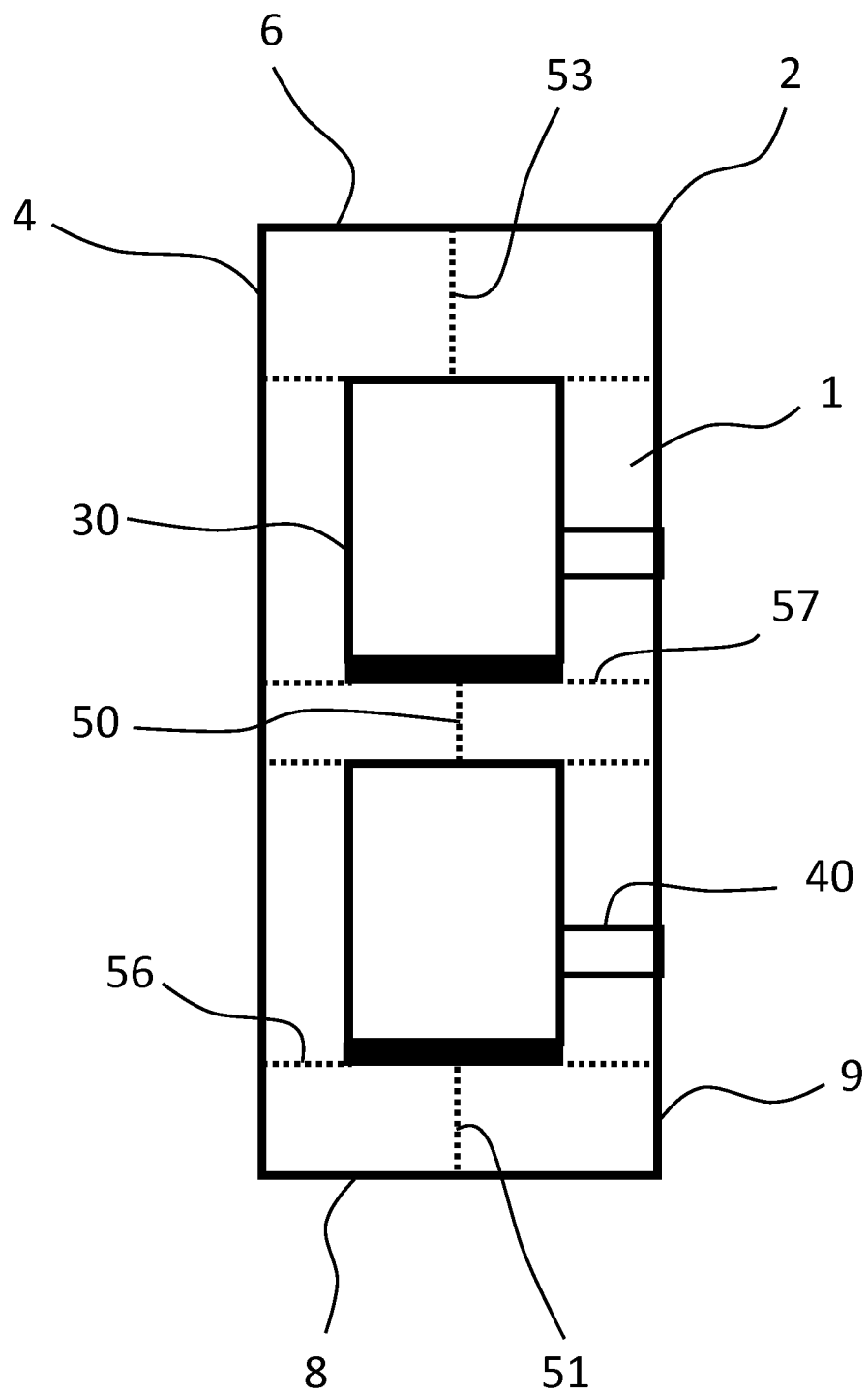

As shown in FIGS. 7 and 8, at least one of the flow gaps A, B, C, D, E, F, G, H comprises a flow guide 50, 51, 52, 53, 54, 55, 56, 57 for adjusting ventilation gas flow. The flow guides 50, 51, 52, 53, 54, 55, 56, 57 may be plate elements with flow openings, choke elements, guide vanes or the like elements adjusting the ventilation gas flow in the flow gaps A, B, C, D, E, F, G, H. With the flow guides 50, 51, 52, 53, 54, 55, 56, 57 the ventilation gas flow may be distributed evenly inside the inner cabinet space 1 and between the different flow gaps A, B, C, D, E, F, G, H.

Accordingly and as shown in FIGS. 7 and 8, at least one of the flow gaps A, B between the two or more separate gas tight precursor supply chambers 30 comprises a flow guide 50, 51 for adjusting ventilation gas flow between the two or more separate gas tight precursor supply chambers 30 and in the flow gaps A, B.

Additionally or alternatively, at least one of the flow gaps C, D, E, F, G, H between the two or more separate gas tight precursor supply chambers 30 and the cabinet walls 3, 4, 6, 7, 8, 9 comprises a flow guide 52, 53, 54, 55, 56, 57 for adjusting ventilation gas flow between the two or more separate gas tight precursor supply chambers 30 and the cabinet walls 3, 4, 6, 7, 8, 9 and in the flow gaps C, D, E, F, G, H.

In the embodiment of FIGS. 7 and 8, at least one of the flow gaps A, B between the two or more separate gas tight precursor supply chambers 30 comprises a flow guide 50, 51 for adjusting ventilation gas flow between the two or more separate gas tight precursor supply chambers 30 and at least one of the flow gaps C, D, E, F, G, H between the two or more separate gas tight precursor supply chambers 30 and the cabinet walls 3, 4, 6, 7, 8, 9 comprises a flow guide 52, 53, 54, 55, 56, 57 for adjusting ventilation gas flow between the two or more separate gas tight precursor supply chambers 30 and the cabinet walls 3, 4, 6, 7, 8, 9 and in the flow gaps C, D, E, F, G, H. This allows adjusting the ventilation gas flow around the separate precursor supply chambers 30 inside the inner cabinet space 1.

FIGS. 13, 14, 15 and 16 shows embodiments of the separate precursor supply chamber 30. A precursor container or precursor vessel is placed or accommodated inside the precursor supply chamber 30 during operating an atomic layer deposition apparatus.

The precursor supply chamber 30 comprises chamber walls 31, 32, 33, 37, 38 defining a chamber space or inner chamber space 78 inside the precursor supply chamber 30, as shown in FIGS. 13 to 16.

The precursor supply chamber 30 further comprises a chamber door assembly 32, 35, 36 arranged to close the precursor supply chamber 30 or the inner chamber space 78 in gas tight manner. The chamber door assembly 32, 35, 36 comprises a chamber door 32 arranged in connection of a door opening of the precursor supply chamber 30.

The door opening may be provided on one side walls or top wall 31 or the bottom wall 38 of the precursor supply chamber 30.

The chamber door 32 is arranged in connection with the door opening for opening and closing the door opening and also for opening and closing the precursor supply chamber 30 and the inner chamber space 78 thereof.

The chamber door 32 comprises door window 34 arranged to provide visual contact to the inner chamber space 78 when the chamber door 32 is in closed position.

The chamber door assembly further comprises a door opening and closing mechanism. The door opening and closing mechanism may comprise hinges or the like enabling opening and closing the chamber door. In the embodiment of the FIGS. 13 to 16, the hinges may be provided to bottom edge of the door 32. The hinges may also be arranged to some other edge of the chamber door 32.

The chamber door closing mechanism further comprises pre-stressing mechanism 35, 36 for pre-stressing the chamber door 32 to the closed position. In the closed position the chamber door 32 is pre-stressed against the chamber body and the chamber walls defining the door opening.

In the embodiment of FIGS. 13 to 16, the closing mechanism comprises gas struts 36 connected to the chamber body or the side walls 33 of the precursor supply chamber 30 at pivot points 35 and to the chamber door 32. Accordingly, the gas struts 36 extend between the chamber body or side walls 33 and the chamber door 32. The gas struts 36 are arranged to press the chamber door 32 against the chamber body in the closed position for closing the precursor supply chamber 30 in gas tight manner.

In a preferred embodiment, there is a gas strut 36 on both sided of the chamber door 32 and on opposite side walls 33.

Figure 14:
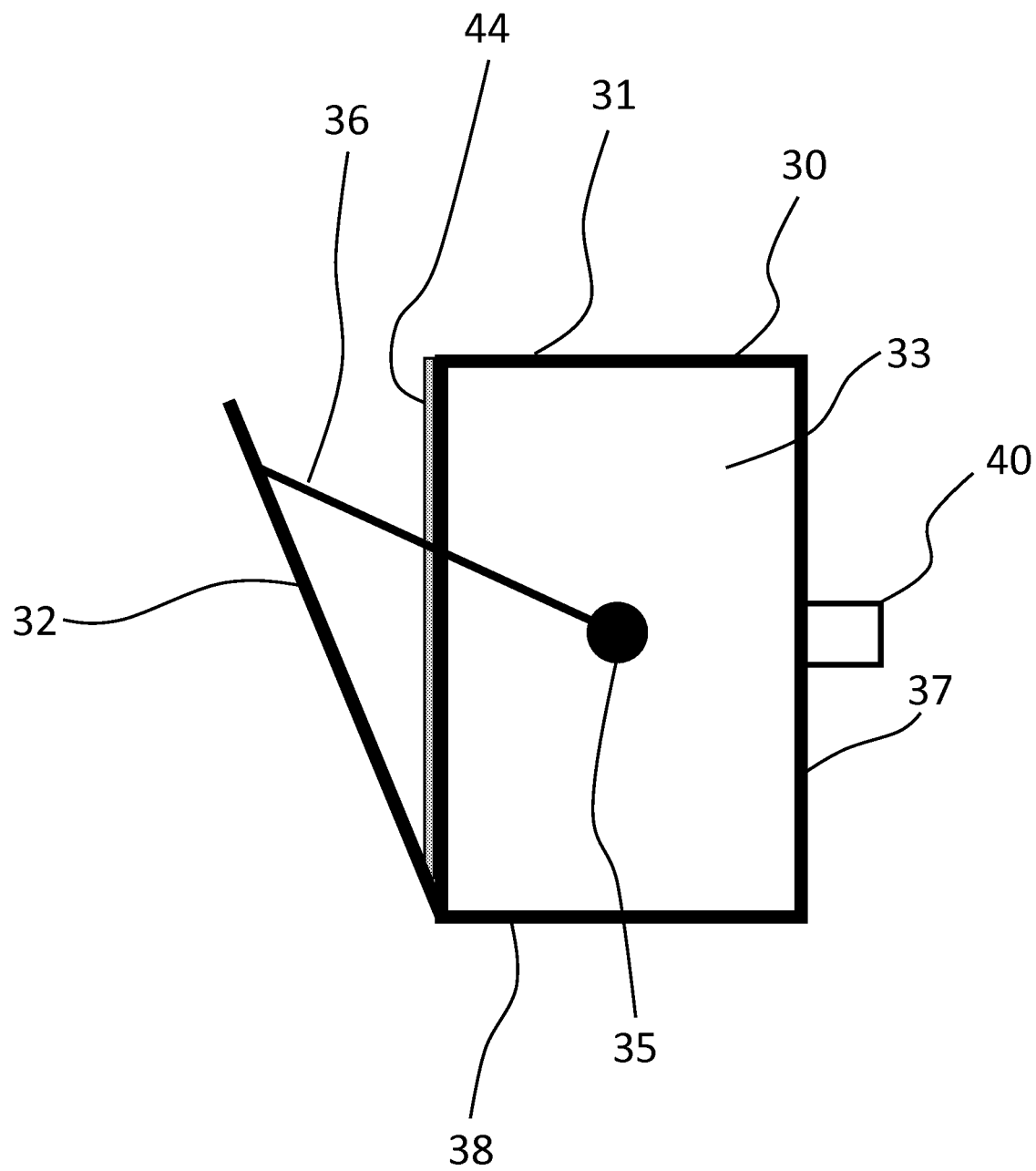

The closing mechanism is arranged to pull the chamber door 32 towards the closed position when the chamber door 32 is opened, as shown in FIG. 14.

Figure 13:
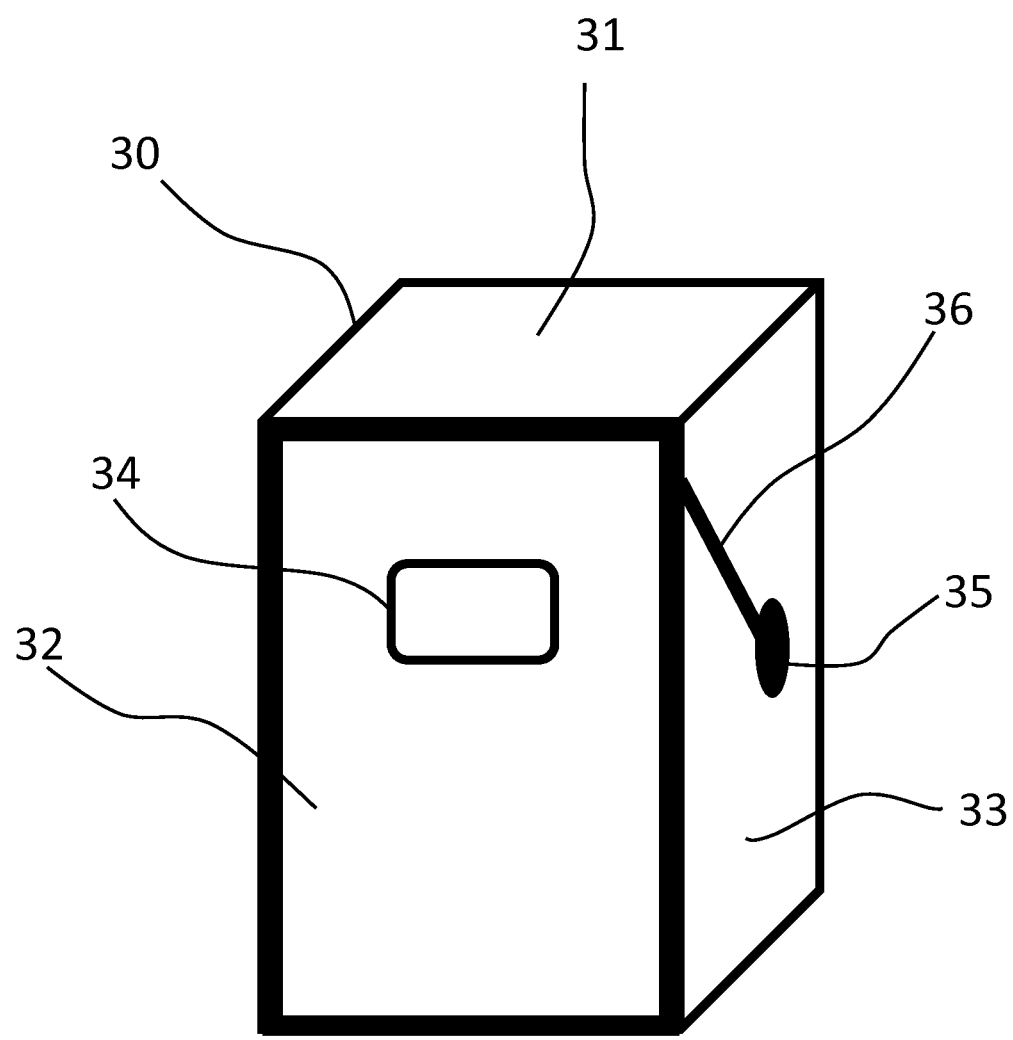
FIGS. 13, 14, 15 and 16 shows schematically different embodiments of the precursor supply chamber.

FIG. 13 shows the precursor supply chamber 30 in closed state and the chamber door assembly 32, 353, 6 in closed position. Accordingly, the chamber door 32 is in closed position and the precursor supply chamber 30 and the inner chamber space 78 closed in gas tight manner. Thus, the chamber door assembly 32, 35, 36 is arranged to close the door opening of the precursor supply chamber 30 in gas tight manner.

Gas tight means in relating to the chamber door assembly, that leakage flow via the chamber door 32 or the door assembly 32, 35, 36 is less that 5 slm, or preferably less than 3 slm or more preferably less than 1 slm.

The gas struts 36 may be replaced by springs of the like.

Further, the closing mechanism may comprise also a lock or latch for securing the chamber door to the closed position. The lock or latch may also comprise pre-stressing means, for example an elastic member or spring, for pre-stressing the chamber door 32 to the closed position. In some embodiments, the lock or latch may provide the sole pre-stressing means and the sole closing mechanism.

Figure 15:
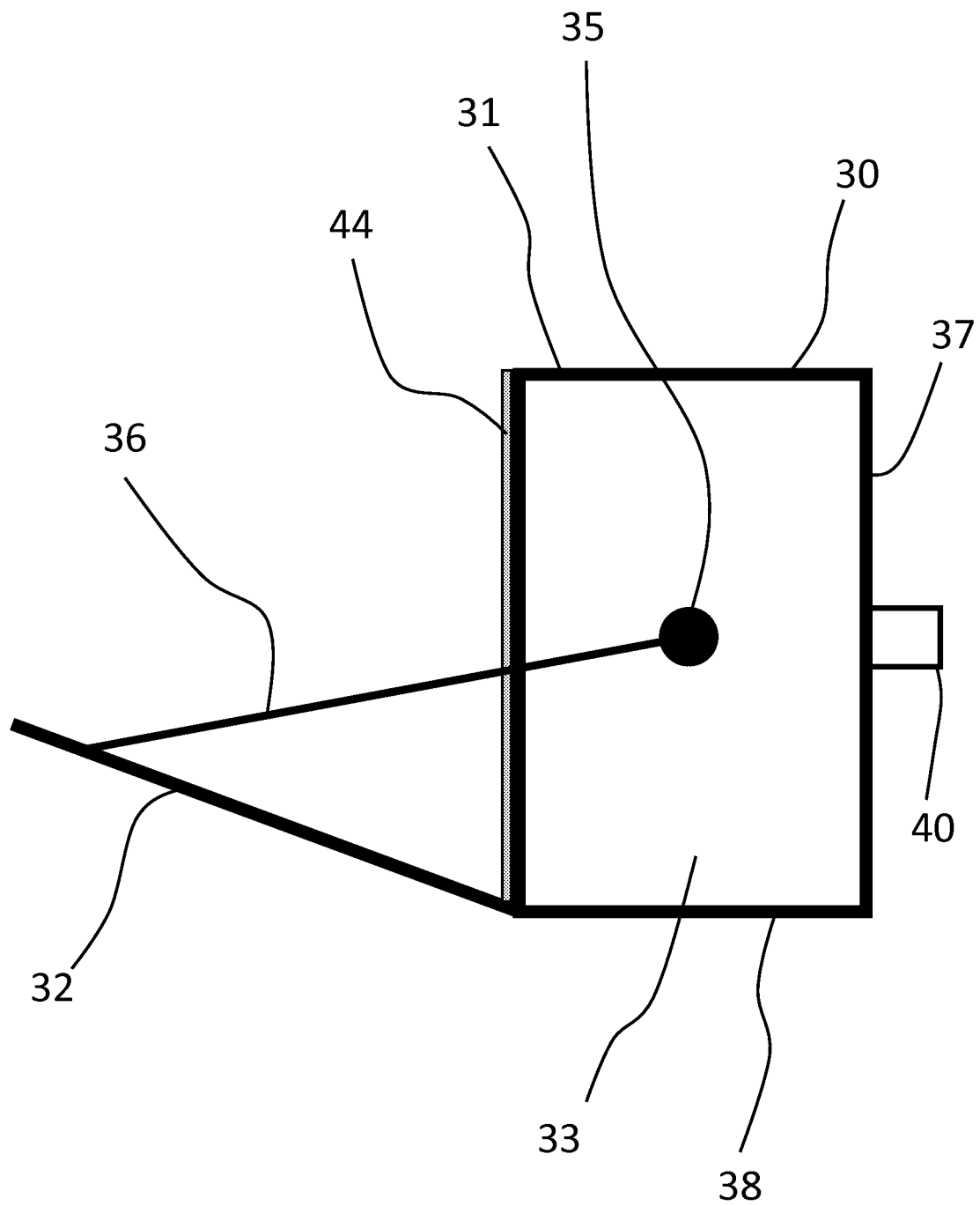

As shown in FIGS. 14 and 15, the chamber door assembly further comprises a sealing member 44 arranged to seal the precursor supply chamber 30 when the chamber door 32 is in closed position. The sealing member 44 is provided to the chamber body and to the door opening. Accordingly, the sealing member 44 is provided to the edges of the side walls 33, the top wall 31 and the bottom wall 38 at the door opening.

Alternatively or additionally, a sealing element 44 may be provided to the chamber door 32.

The sealing element 44 is arranged between the chamber body and the chamber door 32, or between the side walls 33, the top wall 31 and the bottom wall 38, or edges thereof, and the door opening in the closed position of the chamber door 32 for sealing the inner chamber space 78 and the precursor supply chamber 30 in gas tight manner.

The two or more separate gas tight precursor supply chambers 30 comprise a heating element 71, 77 for heating inner chamber space 78 of the two or more separate gas tight precursor supply chambers 30. Accordingly, the two or more separate gas tight precursor supply chambers 30 comprise a heating element 71, 77 provided inside inner chamber space 78 of the two or more separate gas tight precursor supply chambers 30 for heating inner chamber space 78 of the separate gas tight precursor supply chambers 30.

Figure 16:
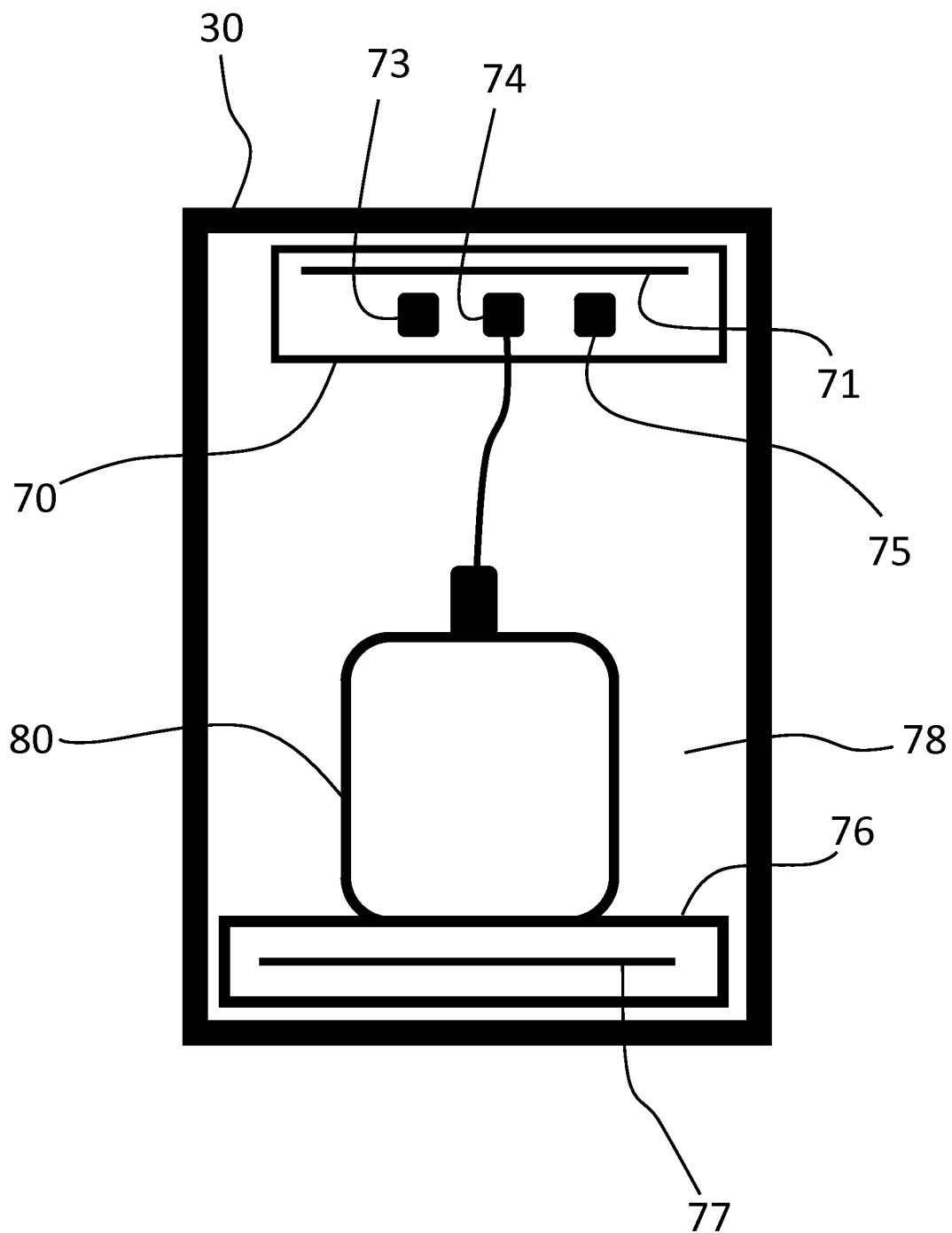

As shown in FIG. 16, the precursor supply chamber 30 is comprises a first heating element 77 provided to the precursor supply chamber 30 and arranged to heat a precursor container 80 inside the chamber space 78 of the precursor supply chamber 30.

In the embodiment of FIG. 16, the precursor supply chamber 30 comprises a precursor container holder 76 inside the precursor supply chamber 30 for holding the precursor container 80. The precursor container holder 76 is arranged at bottom of the chamber space 78 of the precursor supply chamber 30, or to lower part of the chamber space of the precursor supply chamber 30. Further, the precursor container holder 76 is arranged on bottom wall 38 of the precursor supply chamber 30 or in the vicinity thereof inside the chamber space 78. The precursor container 80 further placed on the precursor container holder 76. The precursor container holder 76 is provided as precursor container base in the embodiment of FIG. 16.

The first heating element 77 is provided to the precursor container holder 76 for heating the precursor container 80 held by or on the precursor container holder 76. Thus, the first heating element 77 may heat the precursor container 80 on the precursor container holder 76 for heating the precursor inside the precursor container 80. Thus, the first heating element 77 may be arranged to heat the precursor container 80 from the bottom.

The first heating element 77 may be an electrical heating element or a liquid heating element in which heating liquid is circulated, or some other heating element.

The first heating element 77 is thus arranged to heat the precursor container holder 76 which in turn heats the precursor container 80.

The precursor container holder 76 may also be formed as a vessel and the first heating element 77 is provided to the vessel. The precursor container holder may receive the precursor container 80 into the vessel at least partly. Thus, the first heating element 77 may be arranged to heat the precursor container 80 from the bottom and from the side. The precursor container holder may also be formed as a collar which may be arranged around the precursor container 80. The first heating element 77 may be provided to the collar and arranged to heat the precursor container 80 from the side.

In all the above embodiments, the precursor container 80 and the also the first heating element 77 are arranged to the lower part of the chamber space 78.

In an alternative embodiment, the first heating element 77 may be provided to lower part B of the chamber space of the precursor supply chamber 30. Further, the first heating element 77 may be provided in connection with the bottom wall 38 or on the bottom wall 38 inside the chamber space 78.

In a further embodiment, the first heating element 77 may provided to the bottom wall 38. Thus, the first heating element 77 may be embedded inside to the bottom wall 38.

In the latter embodiments, the precursor container holder 76 may be omitted, if desired.

The precursor supply chamber 30 further comprises a precursor supply element 70 arranged to control precursor supply from the precursor container 80 to outside the precursor supply chamber 30 via a gas tight precursor connection 40, as shown in FIG. 16. The precursor supply element 70 is provided as a block or the like with gas connections for supplying precursor from the precursor container 80 via the precursor connection 40 outside the precursor supply chamber 30 to an atomic layer deposition reactor.

The precursor supply element 70 comprises one or more gas valves 73, 74, 75 arranged to control precursor supply from the precursor container 80 outside the precursor supply chamber 10 via the gas tight precursor connection 40.

The precursor supply element 70 may comprise for example a carrier gas valve 73, a precursor valve 74 and a supply valve 75, as shown in FIG. 16. Accordingly, the valves 73, 74, 75 may be attached fixedly or detachably to the precursor supply element 70.

The precursor supply element 70 is arranged to upper part of the chamber space 78 of the precursor supply chamber.

The precursor supply element 70 is arranged above the precursor container holder 76 inside the precursor supply chamber 30, when the precursor supply chamber 30 comprises the precursor container holder 76.

Further, in one embodiment the precursor supply element 70 is arranged in connection with the top wall 31. The precursor supply element 70 may be attached to the top wall 31 inside the inner chamber space 78 or it may be attached to the side wall 33 in vicinity of the top wall 31.

In one embodiment, the precursor supply element 70 is attached removable to the precursor supply chamber 30 and inside the inner chamber space 78. Thus, the precursor supply element 70 may be provided as removable element to the precursor supply chamber 30. Thus, all the gas valves 73, 74, 75 may be removed simultaneously by removing the precursor supply element 70. This makes maintenance work simpler.

In an alternative embodiment, the precursor supply element 70 may be omitted and the gas valves may be provided to the precursor supply chamber 30 as separate parts. The one or more separate gas valves 73, 74, 75 are arranged to control precursor supply from the precursor container 80 outside the precursor supply chamber 40 via the gas tight precursor connection 40.

The precursor supply chamber 30 further comprises a second heating element 71 provided to the upper part of the chamber space of the precursor supply chamber 30. Furthermore, the second heating element 71 is provided above the first heating element 77 inside the inner chamber space 78 of the precursor supply chamber 30.

Further, preferably the second heating element 71 is provided above the precursor container holder 76 in the precursor supply chamber 30, as shown in FIG. 16.

As shown in the FIG. 16, the second heating element 71 is provided to the precursor supply element 70. Therefore, the second heating element 71 is arranged to heat the precursor supply element 70 and further the precursor gas supplied from the precursor container 80 to the precursor supply element 70. The second heating element also keeps the gas valves 73, 74, 75, as gas conduits in the precursor supply element 70, at the desired temperature as they are provided to the same block. Thus, the temperature of the precursor may be controlled in detail inside the inner chamber space 78 when the precursor is supplied from the precursor container 80 out of the precursor supply chamber 30.

The second heating element 71 may be an electrical heating element or liquid heating element in which heated liquid is circulated, or some other heating element provided inside the chamber space 78.

The second heating element 71 is thus arranged to heat the gas valves and gas conduits in connection with the gas valves 73, 74, 75 for heating the precursor.

In an alternative embodiment, the second heating element 71 may be provided to upper part of the chamber space 78 of the precursor supply chamber 30. Further, the second heating element 71 may be provided in connection with the top wall 31 or on the top wall 31 inside the chamber space 78.

In a further embodiment, the second heating element 71 may be provided to the top wall 31. Thus, the second heating element 71 may be embedded inside to the top wall 31.

In the latter embodiments, the precursor supply element 70 may be omitted, if desired, and the gas valves 73, 74, 75 may be separate gas valves.

In all the above embodiments, the precursor supply element 70 and the also the second heating element 71 are arranged to the upper part of the chamber space 78.

As shown in FIGS. 6, 9, 14 and 15, the precursor supply chamber 30 further comprises the gas tight precursor connection 40 provided to the chamber walls for supplying precursor from the precursor container 80 outside the precursor supply chamber 30. As shown in FIGS. 14 and 15, the gas tight precursor connection 40 extends from the chamber walls and provides a gas tight lead-through into the chamber space 78 from outside of the precursor supply chamber 30. Thus, the gas tight precursor connection is open to the inner chamber space 78 and provides gas tight connection into the inner space chamber 78 from outside of the precursor supply chamber 30.

Gas tight in relation to the precursor connection 40 means that leakage flow into the precursor connection from outside is less than 5 slm or between 0 to 5 slm, or less than 3 slm, or more preferably less than 1 slm. The precursor connection 40 is be preferably provided vacuum tight for forming a vacuum tight precursor connection 40. Vacuum tight means that the leakage flow is less than 0.5 slm or less than 0.1 slm or preferably the leakage is substantially 0 slm.

The gas tight precursor connection 40 is used providing gases in and out of the precursor supply chamber 30 and for supplying electricity into the precursor supply chamber 30, or the like.

In the embodiment of the figures, the gas tight precursor connection 40 is provided to back side wall 37 of the precursor supply chamber 30 opposite the door opening and the chamber door 32.

Figure 9:
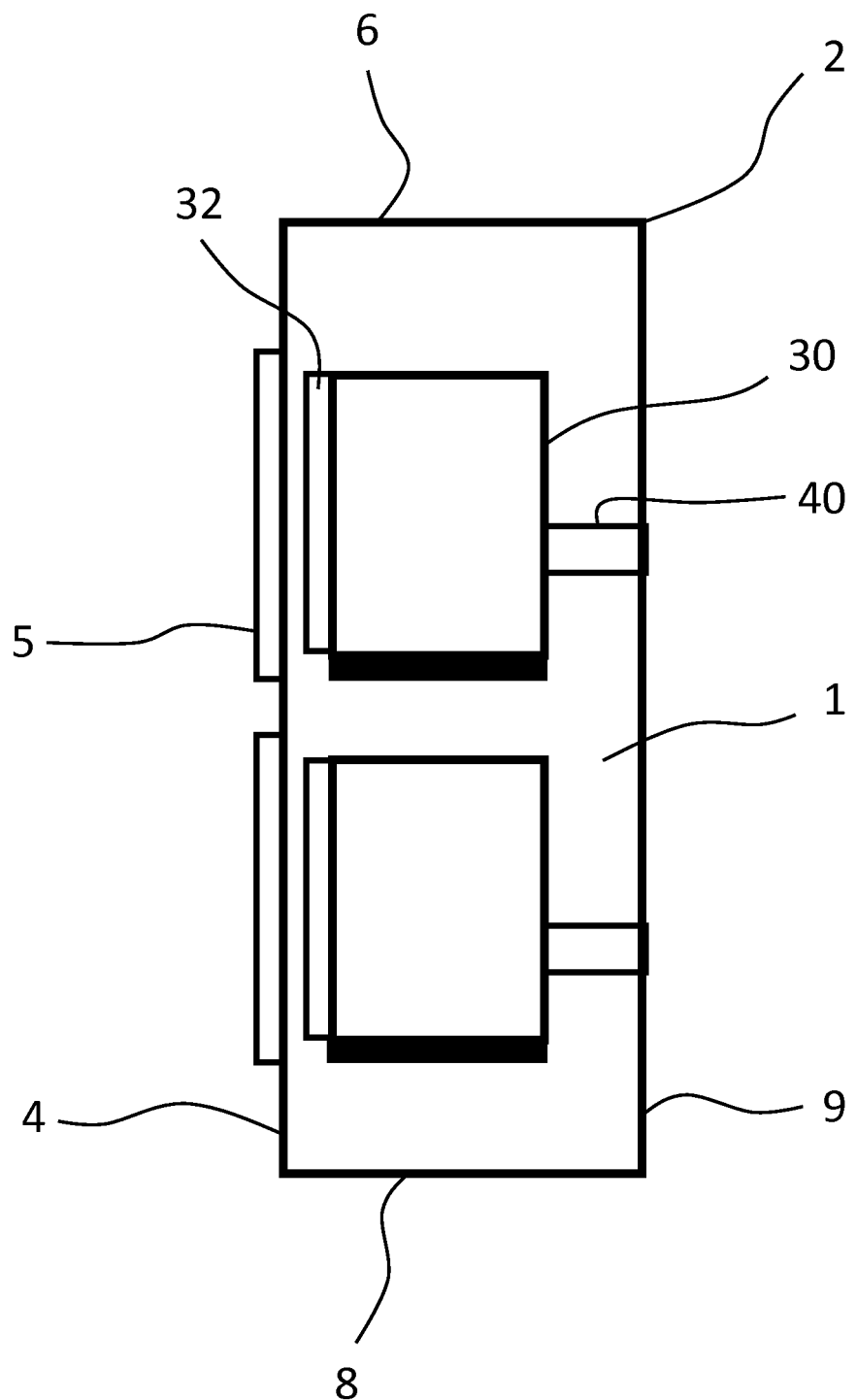
FIG. 9 shows schematically one embodiment of arranging cabinet doors of the precursor supply cabinet and chamber doors of the precursors supply chambers.

The precursor connection or gas tight lead-through connection 40 extends inside the inner cabinet space 1 of the precursor supply cabinet 2 between the precursor supply chamber 30 and the cabinet walls 3, 4, 6, 7, 8, 9 of the precursor supply cabinet 2, as shown in FIGS. 6 and 9.

In the embodiment of FIGS. 6 and 9, the lead-through connection 40 is provided to the back wall 37 of the precursor supply chamber 30 and it extends through the flow gap H to the back cabinet wall 9.

Accordingly, the separate gas tight precursor supply chamber 30 is arranged spaced apart from one cabinet wall 9 inside the inner cabinet space 1 of the precursor supply cabinet 2 such that the flow gap H is provided between the separate gas tight precursor supply chamber 30 and the one cabinet wall 9. The gas tight lead-through connection 40 is arranged to extend inside the inner cabinet space 1 of the precursor supply cabinet 2 between the precursor supply chamber 30 and the one cabinet wall 9 across the flow gap H between the separate gas tight precursor supply chamber 30 and the one cabinet wall 9.

Therefore, the lead-through connection 40 is provided to the ventilated inner cabinet space 1.

The precursor supply chamber 30 may comprise a third heating element provided to the gas tight precursor connection 40. The third heating element may be provided inside the gas tight precursor connection 40 for heating gas conduits and thus the gases such as precursor gas in precursor conduit.

The third heating element may be an electrical heating element or liquid heating element in which heated liquid is circulated, or some other heating element provided inside the gas tight precursor connection 40.

Accordingly, the separate precursor supply chambers 30 form separately heated precursor chambers 30 in the ventilated inner cabinet space 1.

As shown in FIGS. 3 and 9, the two or more separate gas tight precursor supply chambers 30 comprises a chamber door 32 aligned with the two or more cabinet doors 5. The two or more separate gas tight precursor supply chambers 30 are aligned with the two or more cabinet doors 5.

Further, each of the two or more separate gas tight precursor supply chambers 30 comprises a chamber door 32 and the precursor supply cabinet 2 comprises a respective separate cabinet door 5 opposite each the two or more separate gas tight precursor supply chambers 30. This means, that the precursor supply cabinet 2 comprises a separate cabinet door 5 opposite each the two or more separate gas tight precursor supply chambers 30 such that each separate cabinet door 5 is aligned with a respective separate gas tight precursor supply chamber 30.

Accordingly, the precursor supply cabinet 2 comprises a separate cabinet door 5 for each other precursor supply chambers 30.

Figure 10:
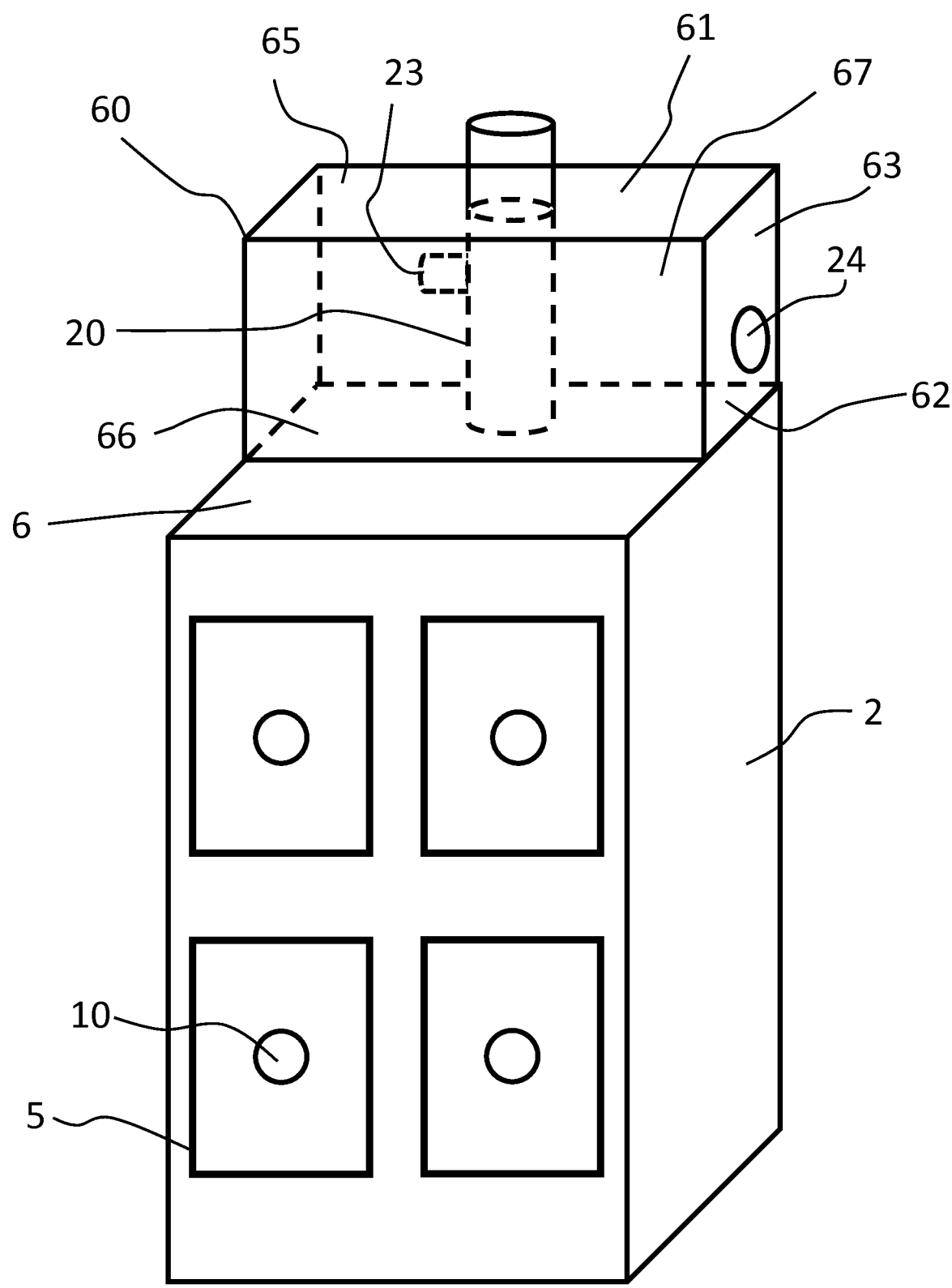
FIG. 10 shows schematically one embodiment of the gas panel box in the precursor supply cabinet.
Figure 11:
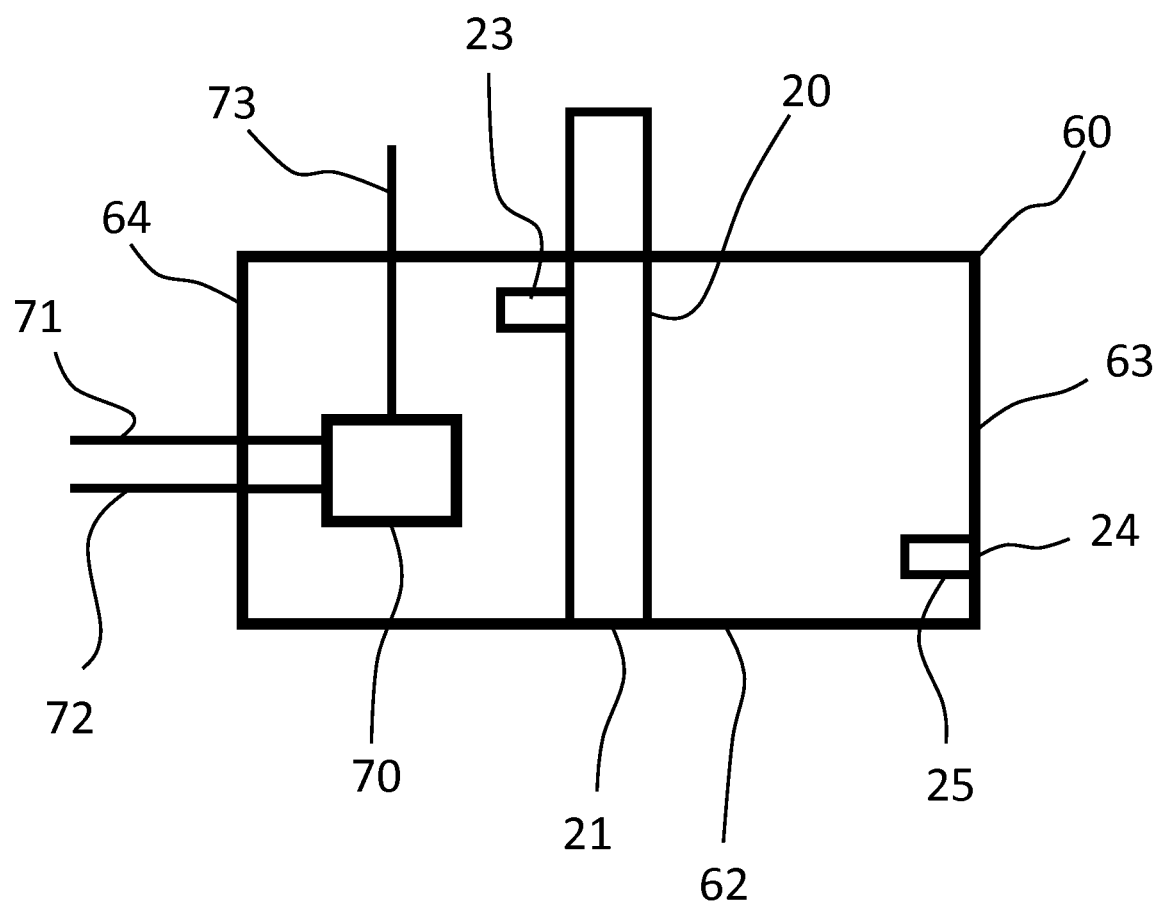
FIG. 11 shows schematically one embodiment of the gas panel box.

FIGS. 10 and 11 show an embodiment, in which the precursor supply cabinet 2 comprises a gas panel box 60 provided outside the inner cabinet space 1. The gas panel box 60 comprises panel box walls 61, 62, 63, 64, 65, 66 defining a panel box inner space 67. The gas panel box further comprises gas connections 70 provided inside the panel box inner space 67 for supplying gaseous precursor gases.

The gas panel box 60 is provided for process gases which are not heated during the atomic layer deposition process.

Gases are supplied into the gas panel box 60 with inlet gas lines 71, 72 and to the gas connections 70 and further from the gas panel box 60 via outlet gas lines 73. The gases brought to the gas panel box 60 are usually hazardous gases.

The gas panel box 60 further comprises a gas panel ventilation inlet connection 24, 25 provided to the panel box walls 61, 62, 63, 64, 65, 66 or to a gas panel box door and arranged to provide ventilation gas into the inner panel box space 67. The gas panel ventilation inlet connection may comprise an inlet opening 24 open to the panel box inner space 67 and to the outside of the gas panel box 60 for supplying ventilation gas to the gas panel box 60. The gas panel ventilation inlet connection may also comprise an inlet channel 25 extending inside the gas panel box or outside the gas panel box 60.

As shown in FIGS. 10 and 11, the gas panel box 60 is connected to the ventilation discharge connection 20, 21, 22 of the precursor supply cabinet 2 for discharging ventilation gas from the panel box inner space 67 of the gas panel box 60. Accordingly, the same ventilation discharge connection 20, 21, 22 is used for discharging ventilation gas form the inner cabinet space 1 of the precursor supply cabinet 2 and from the panel box inner space 67 of the gas panel box 60.

Thus, the ventilation outlet 20, 21 comprises the outlet channel 20 open to the inner cabinet space 1 via the inlet opening 21. The outlet channel 20 extends through the panel box inner space 67 and the outlet channel 20 comprises panel box outlet opening 23 provided to the outlet channel 20 inside the panel box inner space 67, as shown in FIGS. 10 and 11.

The outlet channel 20 or the panel box outlet opening 23 may be connected to the panel box inner space 67 also in other way and the outlet channel 20 does not have to extend through the panel box inner space 67. Thus, the panel box outlet opening 23 may comprise a panel box outlet channel 23 open to the panel box inner space 67 and extending between the panel box inner space 67 and the outlet channel 20 which is connected to the suction device.

Thus, the same suction device 22 and outlet connection or channel 20 may be use for the inner cabinet space 1 and the panel box inner space 67.

The invention has been described above with reference to the examples shown in the figures. However, the invention is in no way restricted to the above examples but may vary within the scope of the claims.

The invention claimed is:

1. A precursor supply cabinet for accommodating one or more precursor containers, the precursor supply cabinet having cabinet walls defining an inner cabinet space, wherein the precursor supply cabinet comprises:
  a ventilation discharge connection arranged to discharge ventilation gas from the inner cabinet space of the precursor supply cabinet;
  one or more ventilation inlet connections arranged to provide ventilation gas into the inner cabinet space of the precursor supply cabinet;
  two or more separate gas tight precursor supply chambers for accommodating precursor containers, the two or more gas tight precursor supply chambers being arranged inside the inner cabinet space of the precursor supply cabinet such that the inner cabinet space of the precursor supply cabinet surrounding the two or more separate gas tight precursor supply chambers is ventilated, the two or more separate gas tight precursor supply chambers arranged spaced apart from each other inside the inner cabinet space of the precursor supply cabinet such that one or more flow gaps (A, B) is provided between the two or more separate gas tight precursor supply chambers, wherein:
    the two or more separate gas tight precursor supply chambers comprises a chamber door aligned with the one or more cabinet doors; or
    the two or more separate gas tight precursor supply chambers are arranged aligned with the one or more cabinet doors; or
    each of the two or more separate gas tight precursor supply chambers comprises a chamber door and the precursor supply cabinet comprises a respective separate cabinet door opposite each the two or more separate gas tight precursor supply chambers; or
    the precursor supply cabinet comprises a separate cabinet door opposite each the two or more separate gas tight precursor supply chambers such that each separate cabinet door is aligned with a respective separate gas tight precursor supply chamber.

2. The precursor supply cabinet according to claim 1, wherein the precursor supply cabinet comprises two or more separate gas tight precursor supply chambers, and that:
  at least two of the two or more separate gas tight precursor supply chambers are arranged adjacent to each other inside the inner cabinet space of the precursor supply cabinet, and at a first distance from each other such that a first flow gap (A) is formed between the adjacent gas tight precursor supply chambers; or
  at least two of the two or more separate gas tight precursor supply chambers are arranged one on top of the other inside the inner cabinet space of the precursor supply cabinet, and at a second distance from each other such that a second flow gap (B) is formed between the adjacent gas tight precursor supply chambers; or
  at least two of the two or more separate gas tight precursor supply chambers are arranged adjacent to each other inside the inner cabinet space of the precursor supply cabinet, and at a first distance from each other such that a first flow gap (A) is formed between the adjacent gas tight precursor supply chambers, and at least two of the two or more separate gas tight precursor supply chambers are arranged one on top of the other inside the inner cabinet space of the precursor supply cabinet, and at a second distance from each other such that a second flow gap (B) is formed between the adjacent gas tight precursor supply chambers.

3. The precursor supply cabinet according to claim 1, wherein:
  the two or more separate gas tight precursor supply chambers are arranged spaced apart from the cabinet walls inside the inner cabinet space of the precursor supply cabinet such that flow gaps (C, D, E, F, G, H) are provided between the two or more separate gas tight precursor supply chambers and the cabinet walls.

4. The precursor supply cabinet according to claim 1, wherein the ventilation discharge connection comprises:
  a ventilation outlet provided to the cabinet walls and open to the inner cabinet space of the precursor supply cabinet; and
  a suction device connected to the ventilation outlet and arranged to discharge ventilation gas from the inner cabinet space of the precursor supply cabinet via the ventilation outlet.

5. The precursor supply cabinet according to claim 4, wherein the precursor supply cabinet comprises a top cabinet wall and the ventilation outlet is provided to the top cabinet wall.

6. The precursor supply cabinet according to claim 1, wherein the one or more ventilation inlet connections comprises a ventilation inlet open to the inner cabinet space of the precursor supply cabinet and arranged to provide ventilation gas into the inner cabinet space of the precursor supply cabinet.

7. The precursor supply cabinet according to claim 1, wherein the one or more ventilation inlet connections comprises a regulator element provided to the ventilation inlet and arranged to adjust the ventilation inlet for adjusting the ventilation gas flow into the inner cabinet space of the precursor supply cabinet via the ventilation inlet.

8. The precursor supply cabinet according to claim 1, wherein:
the precursor supply cabinet comprises one or more cabinet doors, and the one or more ventilation inlet connections are arranged to the one or more cabinet doors.

9. The precursor supply cabinet according to claim 1, wherein the precursor supply cabinet comprises a gas tight lead-through connection extending inside the inner cabinet space of the precursor supply cabinet between the precursor supply chamber and the cabinet walls of the precursor supply cabinet.

10. The precursor supply cabinet according to claim 9, wherein the separate gas tight precursor supply chamber is arranged spaced apart from one cabinet wall inside the inner cabinet space of the precursor supply cabinet such that the flow gap (H) is provided between the separate gas tight precursor supply chamber and the one cabinet wall, and the gas tight lead-through connection is arranged to extend inside the inner cabinet space of the precursor supply cabinet between the precursor supply chamber and the one cabinet wall across the flow gap (H) between the separate gas tight precursor supply chamber and the one cabinet wall.

11. The precursor supply cabinet according to claim 1, wherein:
at least one of the flow gaps (A, B, C, D, E, F, G, H) comprises a flow guide for adjusting ventilation gas flow; or
at least one of the flow gaps (A, B) between the two or more separate gas tight precursor supply chambers comprises a flow guide for adjusting ventilation gas flow between the two or more separate gas tight precursor supply chambers; or
at least one of the flow gaps (C, D, E, F, G, H) between the one or more separate gas tight precursor supply chambers and the cabinet walls comprises a flow guide for adjusting ventilation gas flow between the one or more separate gas tight precursor supply chambers and the cabinet walls; or
at least one of the flow gaps (A, B) between the two or more separate gas tight precursor supply chambers comprises a flow guide for adjusting ventilation gas flow between the two or more separate gas tight precursor supply chambers and at least one of the flow gaps (C, D, E, F, G, H) between the one or more separate gas tight precursor supply chambers and the cabinet walls comprises a flow guide for adjusting ventilation gas flow between the one or more separate gas tight precursor supply chambers and the cabinet walls.

12. The precursor supply cabinet according to claim 1, wherein the precursor supply cabinet comprises a gas panel box provided outside the inner cabinet space, the gas panel box comprises:
panel box walls defining a panel box inner space;
gas connections provided inside the panel box inner space for supplying gaseous precursor gases;
gas panel ventilation inlet connection provided to the panel box walls and arranged to provide ventilation gas into the inner panel box space; and the
the gas panel box is connected to the ventilation discharge connection of the precursor supply cabinet for discharging ventilation gas from the panel box inner space gas panel box.

13. The precursor supply cabinet according to claim 12, wherein the ventilation outlet comprises an outlet channel open to the inner cabinet space and extending through the panel box inner space and the outlet channel comprises panel box outlet opening provided to the outlet channel inside the panel box inner space.

14. The precursor supply cabinet according to claim 1, wherein:
the two or more separate gas tight precursor supply chambers comprise a heating element for heating inner chamber space of the two or more separate gas tight precursor supply chambers; or
the two or more separate gas tight precursor supply chambers comprise a heating element provided inside inner chamber space of the two or more separate gas tight precursor supply chambers for heating inner chamber space of the separate gas tight precursor supply chambers.

15. A precursor supply cabinet for accommodating one or more precursor containers, the precursor supply cabinet having cabinet walls defining an inner cabinet space, wherein the precursor supply cabinet comprises:
a ventilation discharge connection arranged to discharge ventilation gas from the inner cabinet space of the precursor supply cabinet;
one or more ventilation inlet connections arranged to provide ventilation gas into the inner cabinet space of the precursor supply cabinet;
two or more separate gas tight precursor supply chambers for accommodating precursor containers, the two or more gas tight precursor supply chambers being arranged inside the inner cabinet space of the precursor supply cabinet such that the inner cabinet space of the precursor supply cabinet surrounding the two or more separate gas tight precursor supply chambers is ventilated, the two or more separate gas tight precursor supply chambers arranged spaced apart from each other inside the inner cabinet space of the precursor supply cabinet such that one or more flow gaps (A, B) is provided between the two or more separate gas tight precursor supply chambers, wherein the precursor supply cabinet comprises a gas panel box provided outside the inner cabinet space, the gas panel box comprising:
panel box walls defining a panel box inner space;
gas connections provided inside the panel box inner space for supplying gaseous precursor gases; and
a gas panel ventilation inlet connection provided to the panel box walls and arranged to provide ventilation gas into the inner panel box space, wherein the gas panel box is connected to the ventilation discharge connection of the precursor supply cabinet for discharging ventilation gas from the panel box inner space gas panel box.

16. The precursor supply cabinet according to claim 15, wherein the ventilation outlet comprises an outlet channel open to the inner cabinet space and extending through the panel box inner space and the outlet channel comprises panel box outlet opening provided to the outlet channel inside the panel box inner space.

17. The precursor supply cabinet according to claim 15, wherein:
- the two or more separate gas tight precursor supply chambers comprise a heating element for heating inner chamber space of the two or more separate gas tight precursor supply chambers; or
- the two or more separate gas tight precursor supply chambers comprise a heating element provided inside inner chamber space of the two or more separate gas tight precursor supply chambers for heating inner chamber space of the separate gas tight precursor supply chambers.

* * * * *